US009163497B2

(12) United States Patent
Laing et al.

(10) Patent No.: US 9,163,497 B2
(45) Date of Patent: Oct. 20, 2015

(54) FLUID FLOW BACK PREDICTION

(71) Applicant: SAS Institute Inc., Cary, NC (US)

(72) Inventors: Moray Laing, Spring, TX (US); Keith R. Holdaway, Raleigh, NC (US)

(73) Assignee: SAS Institute Inc., Cary, NC (US)

(*) Notice: Subject to any disclaimer, the term of this patent is extended or adjusted under 35 U.S.C. 154(b) by 0 days.

(21) Appl. No.: 14/518,624

(22) Filed: Oct. 20, 2014

(65) Prior Publication Data
US 2015/0112597 A1 Apr. 23, 2015

Related U.S. Application Data

(60) Provisional application No. 61/893,938, filed on Oct. 22, 2013.

(51) Int. Cl.
*G06G 7/50* (2006.01)
*E21B 44/00* (2006.01)
*E21B 47/04* (2012.01)
*E21B 21/08* (2006.01)
(Continued)

(52) U.S. Cl.
CPC .............. *E21B 44/00* (2013.01); *E21B 21/08* (2013.01); *E21B 47/042* (2013.01); *E21B 49/003* (2013.01); *G06F 17/50* (2013.01)

(58) Field of Classification Search
CPC .............. E21B 47/042; E21B 47/0006; E21B 47/0007; E21B 49/003; E21B 49/008; E21B 44/00; E21B 21/08
USPC ......................................... 703/9, 6
See application file for complete search history.

(56) References Cited

U.S. PATENT DOCUMENTS 5,205,166 A * 4/1993 McCann et al. ............ 73/152.19
5,454,436 A 10/1995 Jardine et al.
(Continued)

FOREIGN PATENT DOCUMENTS

CA 2431370 9/2008
CA 2337122 5/2009
(Continued)

OTHER PUBLICATIONS

Canon, Javier M. et al., "Avoiding Proppant Flowback in Tight-Gas Completions with Improved Fracture Design", Oct. 5-8, 2003, SPE Annual Technical Conference and Exhibition, Society of Petroleum Engineers.*

(Continued)

*Primary Examiner* — Kamini S Shah
*Assistant Examiner* — Cedric D Johnson
(74) *Attorney, Agent, or Firm* — Bell & Manning, LLC

(57) ABSTRACT

A computing device configured to determine when an alarm is triggered for a drilling operation is provided. Measured drilling data that includes a value measured for an input variable during a previous connection event of a drilling operation is received. A predicted value for a fluid flow back measure is determined by executing a predictive model with the measured drilling data as an input. The predictive model is determined using previous drilling data that includes a plurality of values measured for the input variable during a second drilling operation. The second drilling operation is a previous drilling operation at a different geographic wellbore location than the drilling operation. A fluid flow back measurement datum determined from sensor data is compared to the determined predicted value for the fluid flow back measure. An alarm is triggered on the drilling operation based on the comparison.

44 Claims, 12 Drawing Sheets

(51) Int. Cl.
*E21B 49/00* (2006.01)
*G06F 17/50* (2006.01)

(56) References Cited

U.S. PATENT DOCUMENTS

| | | | |
|---|---|---|---|
| 5,787,986 | A | 8/1998 | Weaver et al. |
| 5,952,569 | A | 9/1999 | Jervis et al. |
| 6,234,250 | B1 | 5/2001 | Green et al. |
| 6,820,702 | B2 | 11/2004 | Niedermayr et al. |
| 6,892,813 | B2 | 5/2005 | Nguyen et al. |
| 6,968,909 | B2 | 11/2005 | Aldred et al. |
| 7,966,166 | B2 | 6/2011 | Thambynayagam et al. |
| 7,998,911 | B1 | 8/2011 | Berger et al. |
| 8,210,283 | B1 | 7/2012 | Benson et al. |
| 8,244,654 | B1 | 8/2012 | Hobgood et al. |
| 8,417,495 | B2 | 4/2013 | Dashevskiy |
| 8,458,000 | B2 | 6/2013 | Narayanan et al. |
| 8,474,550 | B2 | 7/2013 | Byreddy et al. |
| 8,490,685 | B2 | 7/2013 | Tolman et al. |
| 8,522,865 | B2 | 9/2013 | Atencio |
| 8,527,248 | B2 | 9/2013 | Thambynayagam et al. |
| 8,646,523 | B2 | 2/2014 | Huang et al. |
| 2004/0124012 | A1 | 7/2004 | Dunlop et al. |
| 2004/0148147 | A1 | 7/2004 | Martin |
| 2004/0256152 | A1 | 12/2004 | Dashevskiy et al. |
| 2008/0255892 | A1 | 10/2008 | Orangi et al. |
| 2008/0289877 | A1 | 11/2008 | Nikolakis-Mouchas et al. |
| 2009/0030858 | A1* | 1/2009 | Hegeman et al. ............... 706/17 |
| 2009/0076873 | A1 | 3/2009 | Johnson et al. |
| 2009/0093998 | A1 | 4/2009 | Fluegge et al. |
| 2009/0095469 | A1 | 4/2009 | Dozier |
| 2009/0132458 | A1* | 5/2009 | Edwards et al. ............... 706/50 |
| 2009/0143923 | A1 | 6/2009 | Breed |
| 2009/0260880 | A1 | 10/2009 | Thambynayagam et al. |
| 2010/0076740 | A1 | 3/2010 | Kuchuk et al. |
| 2010/0288495 | A1 | 11/2010 | Willberg et al. |
| 2011/0073367 | A1 | 3/2011 | Chapman et al. |
| 2011/0153296 | A1 | 6/2011 | Sadlier et al. |
| 2011/0220362 | A1 | 9/2011 | Huang et al. |
| 2011/0220410 | A1 | 9/2011 | Aldred et al. |
| 2012/0029710 | A1 | 2/2012 | Dodderi et al. |
| 2012/0059521 | A1 | 3/2012 | Iversen et al. |
| 2012/0123756 | A1 | 5/2012 | Wang et al. |
| 2013/0025851 | A1 | 1/2013 | Laing et al. |
| 2013/0087385 | A1 | 4/2013 | Pena |
| 2013/0228328 | A1 | 9/2013 | Chapman |
| 2013/0231781 | A1 | 9/2013 | Chapman |
| 2013/0231787 | A1 | 9/2013 | Chapman et al. |
| 2013/0261033 | A1 | 10/2013 | Nguyen |
| 2013/0292178 | A1 | 11/2013 | Burress et al. |
| 2013/0325351 | A1 | 12/2013 | Haberer et al. |
| 2014/0116776 | A1 | 5/2014 | Marx et al. |
| 2014/0184228 | A1 | 7/2014 | Fu et al. |
| 2014/0238663 | A1 | 8/2014 | Nieuwoudt et al. |
| 2015/0081222 | A1 | 3/2015 | Laing et al. |

FOREIGN PATENT DOCUMENTS

| | | |
|---|---|---|
| CA | 2812394 | 9/2013 |
| EP | 0718641 | 6/1996 |
| EP | 1398458 | 3/2008 |
| EP | 2327857 | 6/2011 |
| WO | WO 2004012040 | 2/2004 |
| WO | WO 2009079234 | 6/2009 |
| WO | WO 2011019421 | 2/2011 |
| WO | WO 2012012098 | 1/2012 |
| WO | WO 2012087466 | 6/2012 |
| WO | WO 2012122470 | 9/2012 |
| WO | WO 2013052735 | 4/2013 |
| WO | WO2013066746 | 5/2013 |
| WO | WO2013066746 A1 * | 5/2013 |
| WO | WO 2013181143 | 12/2013 |
| WO | WO 2014110058 | 7/2014 |

OTHER PUBLICATIONS

Saeed, Saad et al., "Event Detection for Managed-Pressure Drilling: A New Paradigm", Oct. 8-12, 2012, SPE Annual Technical Conference and Exhibition, Society of Petroleum Engineers.*
K. Holdaway, Data Management, Chapter 2 of Harness Oil and Gas Big Data with Analytics: Optimize Exploration and Production with Data Driven Models, Published by John Wiley & Sons, Inc., Hoboken, New Jersey, May 5, 2014, pp. 33-62.
K. Holdaway, Drilling and Completion Optimization, Chapter 5 of Harness Oil and Gas Big Data with Analytics: Optimize Exploration and Production with Data Driven Models, Published by John Wiley & Sons, Inc., Hoboken, New Jersey, May 5, 2014, pp. 139-174.
K. Holdaway, Production Optimization, Chapter 8 of Harness Oil and Gas Big Data with Analytics: Optimize Exploration and Production with Data Driven Models, Published by John Wiley & Sons, Inc., Hoboken, New Jersey, May 5, 2014, pp. 243-273.
K. Holdaway, Exploratory and Predictive Data Analysis, Chapter 9 of Harness Oil and Gas Big Data with Analytics: Optimize Exploration and Production with Data Driven Models, Published by John Wiley & Sons, Inc., Hoboken, New Jersey, May 5, 2014, pp. 275-308.
K. Holdaway, Big Data: Structured and Unstructured, Chapter 10 of Harness Oil and Gas Big Data with Analytics: Optimize Exploration and Production with Data Driven Models, Published by John Wiley & Sons, Inc., Hoboken, New Jersey, May 5, 2014, pp. 309-341.
Poloni et al., Hybridization of a multi-objective genetic algorithm, a neural network and a classical optimizer for a complex design problem in fluid dynamics, Comput. Methods Appl. Mech. Engrg., vol. 186, 2000, pp. 403-420.
Queipo et al., Surrogate modeling-based optimization of SAGD processes, Journal of Petroleum Science and Engineering, vol. 35, 2002, pp. 83-93.
Queipo et al., Surrogate modeling-based optimization of SAGD processes, 2001 SPE International Thermal Operations and Heavy Oil Symposium, Porlamar, Margarita Island, Venezuela, Mar. 12, 2001, pp. 1-9.
Najeh et al., Neural Network Meta-Modeling of Steam Assisted Gravity Drainage Oil Recovery Processes, Iran. J. Chem. Chem. Eng., vol. 29, No. 3, 2010, pp. 109-122.
Maldonado et al., Leveraging Ensemble Models in SAS® Enterprise Miner™, Available from web Jul. 24, 2014, SAS Institute Inc., pp. 1-15.
Dadashpour et al., Porosity and Permeability Estimation by Gradient-Based History Matching using Time-Lapse Seismic Data, 15th SPE Middle East Oil & Gas Show and Conference, Kingdom of Bahrain, Mar. 11, 2007, pp. 1-13.
A. Azad, Rapid SAGD Simulation Considering Geomechanics for Closed Loop Reservoir Optimization, thesis, University of Alberta, Spring 2012, pp. 1-191.
M. Rousset, Building fast proxies for optimization of thermal reservoir simulation, Dec. 16, 2011, pp. 1-5.
A. Sengel, Development of Artificial Neural Networks for Steam Assisted Gravity Drainage (SAGD) Recovery Method in Heavy Oil Reservoirs, thesis, Pennsylvania State University, Aug. 2013, pp. 1-128.
Liu et al., Link Analysis Using SAS® Enterprise Miner™, Available from web Jul. 23, 2014, SAS Institute Inc., pp. 1-17.
Dean et al., What's New in SAS® Enterprise Miner™ 13.1, Available from web Jul. 23, 2014, SAS Institute Inc., pp. 1-16.
K. Mazerov, Smart flowback tool targets automation of kick, lost-circulation detection process | Drilling Contractor, Available on web Mar. 7, 2013.
International Search Report and Written Opinion issued in PCT/US2014/056455, Jan. 14, 2015.
International Search Report and Written Opinion issued in PCT/US2014/061479, Jan. 14, 2015.
Office Action issued in Canadian Application No. 2864265, Jan. 9, 2015.
The Pason AutoDriller—Optimal Drilling Control and Accuracy, Pason, Product application note, Revised Jan. 5, 2012, pp. 1-4.
DataFlux Event Stream Processing Engine User's Guide, Version 1.3, Jan. 24, 2013.

* cited by examiner

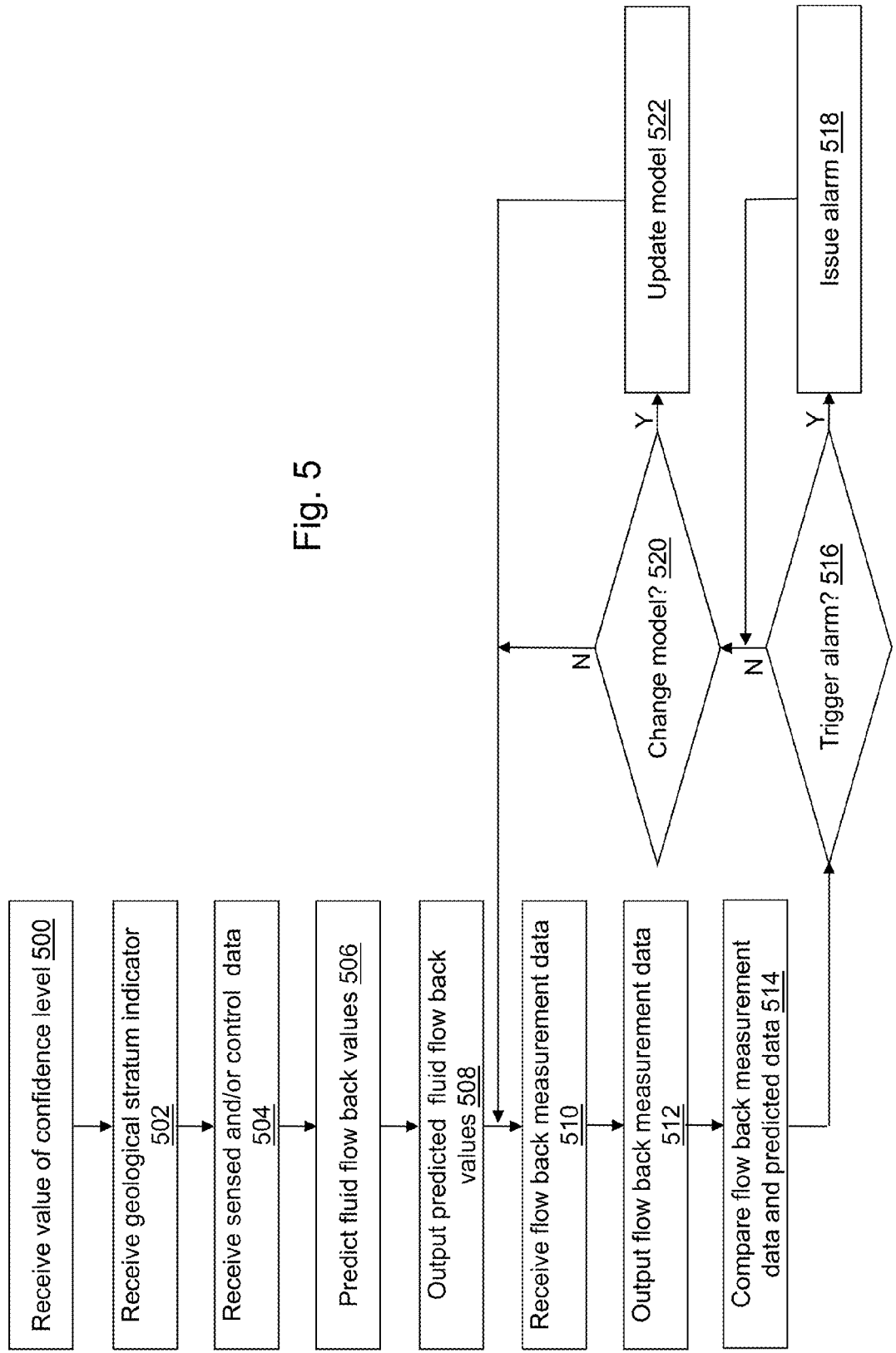

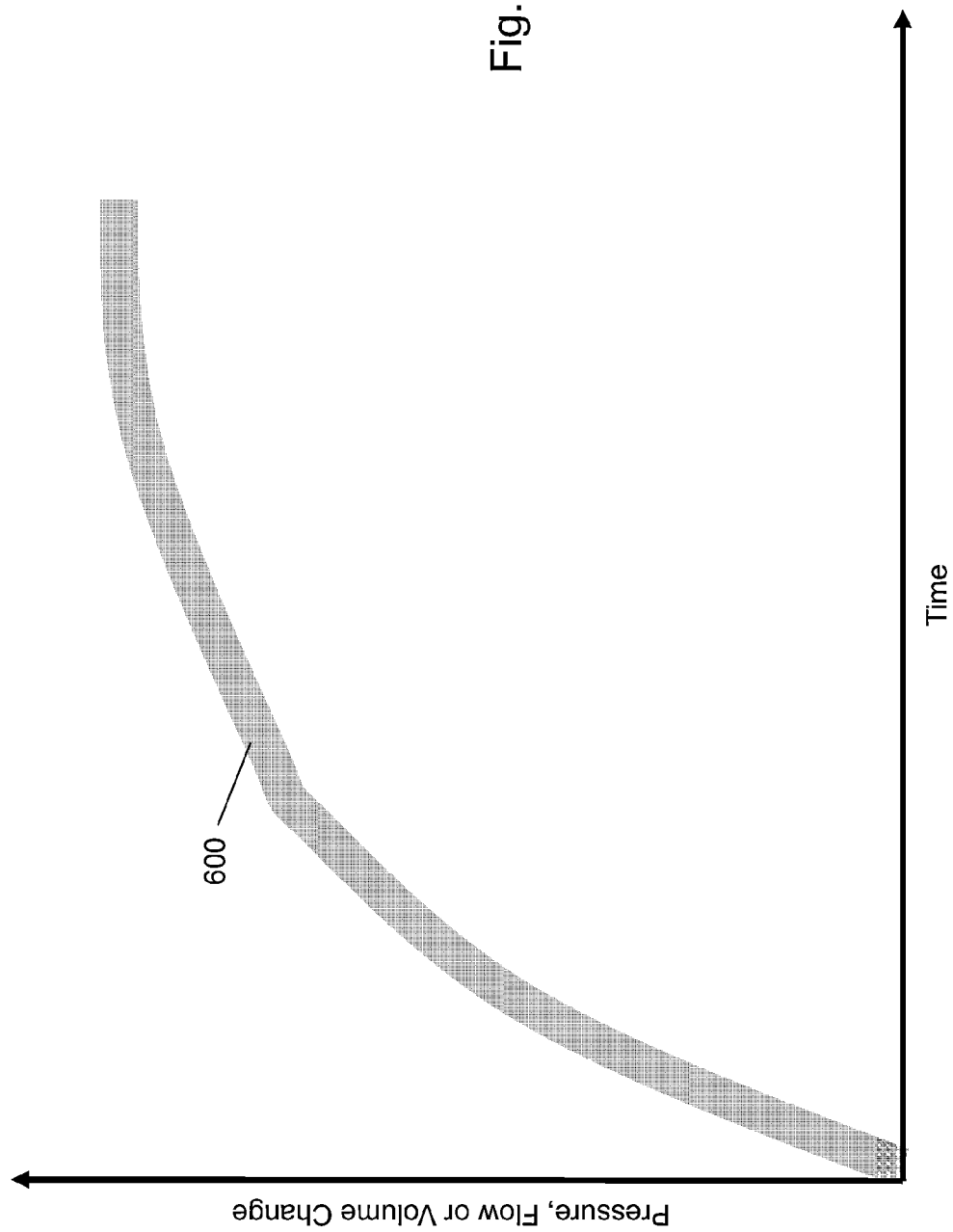

FLUID FLOW BACK PREDICTION

CROSS-REFERENCE TO RELATED APPLICATIONS

The present application claims the benefit of priority of 35 U.S.C. §119(e) to U.S. Provisional Patent Application No. 61/893,938 filed on Oct. 22, 2013, the entire contents of which is hereby incorporated by reference.

BACKGROUND

Drilling holes of all types and sizes for various industries (water, natural gas, oil, construction, telecommunications, electric, etc.) in various environments (land, frozen land, seabed, deep seabed, etc.) can be a complex, expensive, and risky process. While drilling in soft geology, fluid that is circulated throughout a wellbore annulus creates friction pressure in addition to a hydrostatic pressure of the fluid against vertical depth. These pressures cause variance in an effect known as fluid flow back that is experienced during pumps off or during connection periods as part of the drilling process. The effect is that, as the geology swells back into shape, the fluid in the wellbore is pushed back to the surface causing flow back to surface equipment and monitoring systems. The effect is similar that seen when a wellbore is suffering from fluid influx, which is a precursor to a wellbore kick. Wellbore kicks can be catastrophic if they are not diagnosed early and properly responded to by the drilling program.

SUMMARY

In an example embodiment, a method of determining when an alarm is triggered for a drilling operation is provided. Measured drilling data that includes a value measured for an input variable during a previous connection event of a drilling operation is received. A predicted value for a fluid flow back measure is determined by executing a predictive model with the measured drilling data as an input. The predictive model is determined using previous drilling data that includes a plurality of values measured for the input variable during a second drilling operation. The second drilling operation is a previous drilling operation at a different geographic wellbore location than the drilling operation. A fluid flow back measurement datum is received. The fluid flow back measurement datum is determined from sensor data generated by a sensor used as part of the drilling operation. The received fluid flow back measurement datum is compared to the determined predicted value for the fluid flow back measure. An alarm is triggered on the drilling operation based on the comparison In another example embodiment, a computer-readable medium is provided having stored thereon computer-readable instructions that, when executed by a computing device, cause the computing device to perform the method of determining when an alarm is triggered for a drilling operation.

In yet another example embodiment, a computing device is provided. The computing device includes, but is not limited to, a processor and a computer-readable medium operably coupled to the processor. The computer-readable medium has instructions stored thereon that, when executed by the computing device, cause the computing device to perform the method of determining when an alarm is triggered for a drilling operation.

These and other embodiments can optionally include one or more of the following features:

The instructions or the method can include receiving the previous drilling data, and determining the predictive model using the received previous drilling data.

The predictive model can be determined using a neural network model. The predictive model can be determined using a decision tree model. The predictive model can be determined based on a correlation between the input variable and the fluid flow back measure identified in the received previous drilling data.

The input variable can be selected from a group comprising a flow-in rate variable, a flow-out rate variable, a surface pressure variable, a downhole pressure variable, a differential pressure variable, a bit diameter variable, a fluid temperature variable, a fluid density variable, a fluid tank volume variable, a mud rheology property variable, a rate of penetration variable, a torque variable, a drill pipe rotation speed variable, and a drill bit rotation speed variable.

The fluid flow back measure can be selected from a group comprising a flow back pressure, a flow back flow rate, and a flow back volume.

The sensor can be selected from a group comprising a flow back pressure sensor, a flow back flow rate sensor, and a flow back volume sensor.

Determining the predictive model can include defining a training dataset as a first portion of the received previous drilling data; defining a validation dataset as a second portion of the received previous drilling data; defining a first predictive model configuration; training a first predictive model using the defined training dataset based on the defined first predictive model configuration; predicting model output data with the defined validation dataset as an input to the trained first predictive model; comparing the predicted model output data to output data of the validation dataset; and determining a first validity score for the trained first predictive model based on comparing the predicted model output data to output data of the validation dataset.

Determining the predictive model can further include defining a second predictive model configuration; training a second predictive model using the defined training dataset based on the defined second predictive model configuration; predicting second model output data with the defined validation dataset as an input to the trained second predictive model; comparing the predicted second model output data to the output data of the validation dataset; and determining a second validity score for the trained second predictive model based on comparing the predicted second model output data to the output data of the validation dataset.

The predictive model can be determined as the trained first predictive model or the trained second predictive model based on a comparison between the determined first validity score and the determined second validity score.

The instructions or the method can further select the predictive model based on a geological indicator.

The instructions or the method can further change the predictive model based on a geological indicator associated with the received fluid flow back measurement datum.

The alarm can be triggered when the received fluid flow back measurement datum is greater than $P_v + P_v C_l / 2$, where $P_v$ is the determined predicted value for the fluid flow back measure and $C_l$ is a numeric value of a confidence level.

The confidence level can indicate a certainty that the received fluid flow back measurement datum falls within an expected variability of the determined predicted value for the fluid flow back measure.

The instructions or the method can further determine an acceptable fluid flow back band, wherein a maximum point of the acceptable fluid flow back band is defined as $P_v+P_vC_l/2$ and a minimum point of the acceptable fluid flow back band is defined as $P_v-P_lC_l/2$, where $P_v$ is the determined predicted value for the fluid flow back measure and $C_l$ is a numeric value of a confidence level.

The alarm can be triggered when the received fluid flow back measurement datum is greater than the maximum point of the acceptable fluid flow back band or when the received fluid flow back measurement datum is less than the minimum point of the acceptable fluid flow back band.

The determined acceptable fluid flow back band can be output to a display device.

The received fluid flow back measurement datum can be output to a display device.

The alarm can be triggered by a display device presentation of a dial that indicates the received fluid flow back measurement datum, an acceptable fluid flow back region, a greater than acceptable fluid flow back region, and a less than acceptable fluid flow back region.

The computer-readable instructions can be executed by an event stream processing engine.

Other principal features of the disclosed subject matter will become apparent to those skilled in the art upon review of the following drawings, the detailed description, and the appended claims.

BRIEF DESCRIPTION OF THE DRAWINGS

Illustrative embodiments of the disclosed subject matter will hereafter be described referring to the accompanying drawings, wherein like numerals denote like elements.

FIG. 5 depicts a flow diagram illustrating examples of operations performed by the prediction device of FIG. 4 in accordance with an illustrative embodiment.

FIGS. 6a, 6b, and 6c depict a fluid flow back prediction as a function of time during a drilling operation in accordance with an illustrative embodiment.

DETAILED DESCRIPTION

Figure 1:
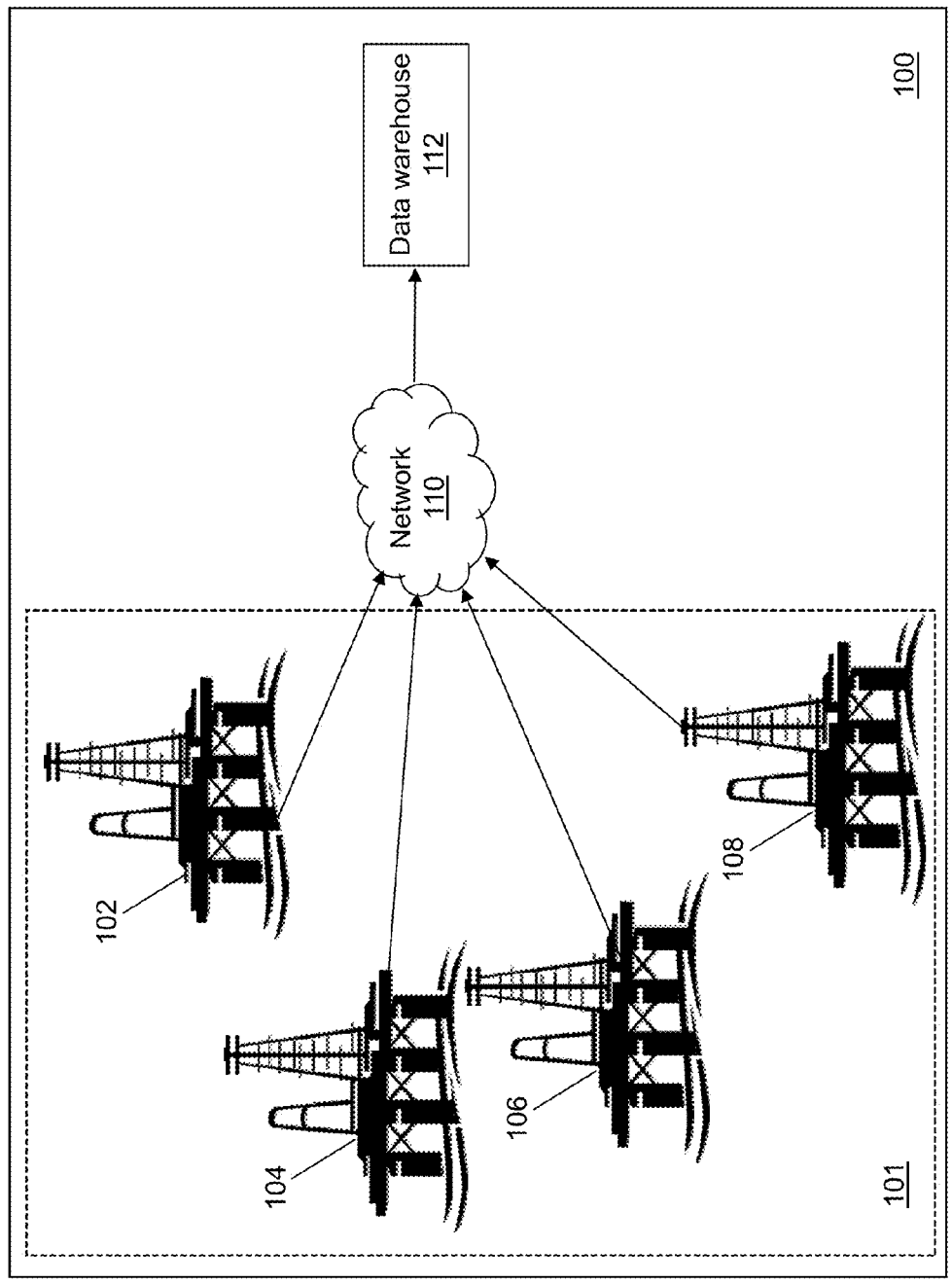
FIG. 1 depicts a block diagram of a drilling data gathering system in accordance with an illustrative embodiment.

Referring to FIG. 1, a block diagram of a drilling data gathering system 100 is shown in accordance with an illustrative embodiment. Drilling data gathering system 100 may include a plurality of drilling rigs 101, a network 110, and a data warehouse 112. Fewer, different, and/or additional components may be incorporated into drilling data gathering system 100. For illustration, the plurality of drilling rigs 101 may include a first drilling rig 102, a second drilling rig 104, a third drilling rig 106, a fourth drilling rig 108. The plurality of drilling rigs 101 may include any number of drilling rigs. A drilling rig of the plurality of drilling rigs 101 may be active or inactive. The plurality of drilling rigs 101 may be configured to drill holes of any type and size for various industries (e.g., water, natural gas, oil, construction, telecommunications, electric, etc.) in various environments (e.g., land, frozen land, seabed, deep seabed, etc.). The plurality of drilling rigs 101 may be distributed locally, regionally, or globally.

Network 110 may include one or more networks of the same or different types. Network 110 can be any type or combination of wired and/or wireless public or private network including a cellular network, a local area network, a wide area network such as the Internet, etc. Network 110 further may comprise sub-networks and consist of any number of devices. The plurality of drilling rigs 101 send communications through network 110 to data warehouse 112. The plurality of drilling rigs 101 may communicate using various transmission media that may be wired and/or wireless as understood by those skilled in the art.

Data warehouse 112 stores drilling data from the plurality of drilling rigs 101 that includes a plurality of values measured for each of a plurality of drilling variables during a hole or well drilling operation including during a connection event. For example, a connection event may be associated with connection of a new section of standpipe. The plurality of values may be measured for each of the plurality of drilling variables at a plurality of time points during a time period. For example, the plurality of values may be measured for each of the plurality of drilling variables each second for a thirty-day time period though other time period lengths and measurement intervals may be used.

Figure 2:
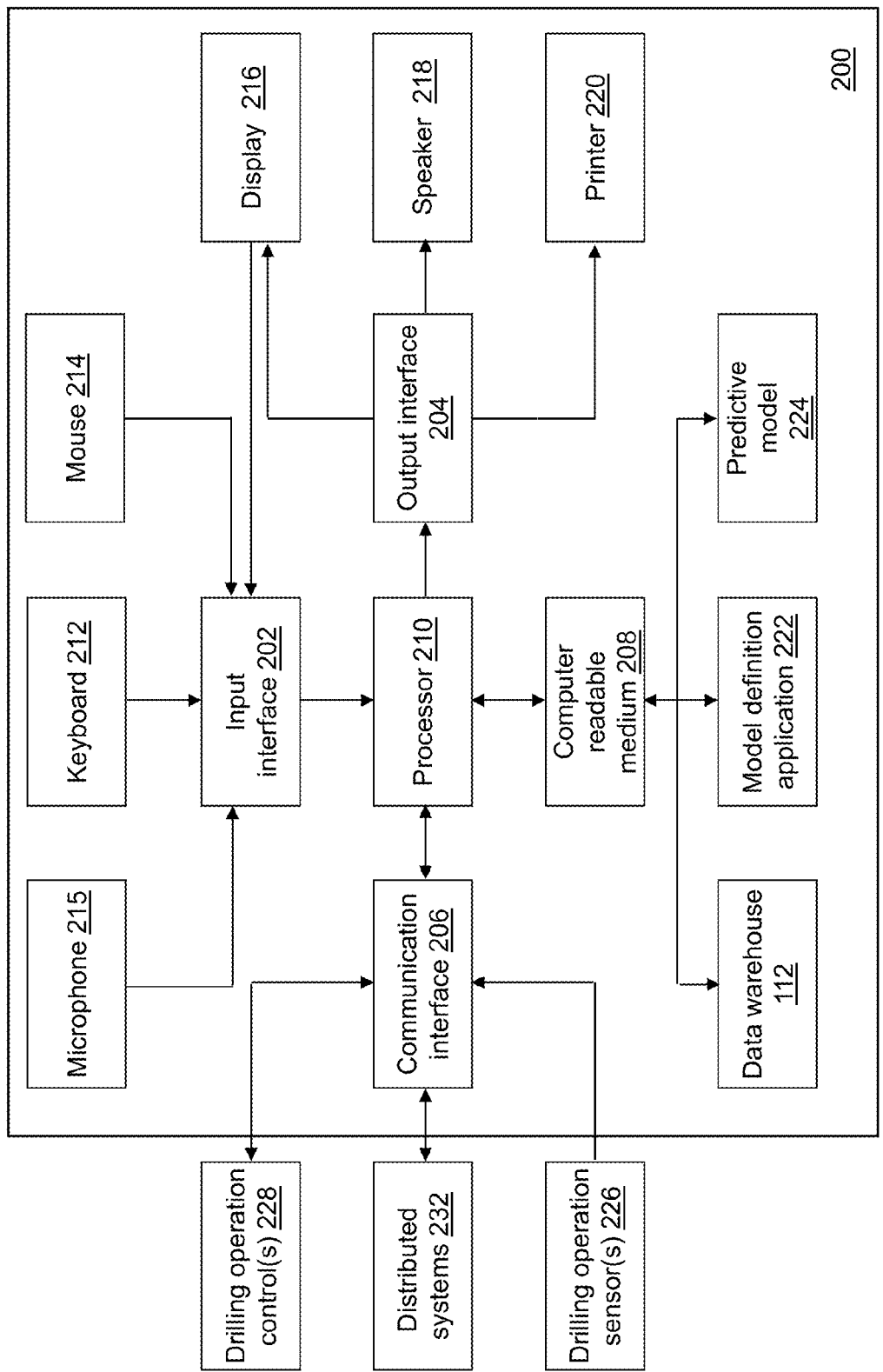
FIG. 2 depicts a block diagram of a model definition device in accordance with an illustrative embodiment.

Referring to FIG. 2, a block diagram of a model definition device 200 is shown in accordance with an illustrative embodiment. Model definition device 200 may be located on a drilling rig of the plurality of drilling rigs 101 or remote from the plurality of drilling rigs 101. Model definition device 200 may include an input interface 202, an output interface 204, a communication interface 206, a computer-readable medium 208, a processor 210, a model definition application 222, data warehouse 112, and a predictive model 224. Fewer, different, and/or additional components may be incorporated into model definition device 200.

Input interface 202 provides an interface for receiving information from the user for entry into model definition device 200 as understood by those skilled in the art. Input interface 202 may interface with various input technologies including, but not limited to, a keyboard 212, a mouse 214, a microphone 215, a display 216, a track ball, a keypad, one or more buttons, etc. to allow the user to enter information into model definition device 200 or to make selections presented in a user interface displayed on the display. The same interface may support both input interface 202 and output interface 204. For example, display 216 comprising a touch screen provides user input and presents output to the user. Model definition device 200 may have one or more input interfaces that use the same or a different input interface technology. The input interface technology further may be accessible by model definition device 200 through communication interface 206.

Output interface 204 provides an interface for outputting information for review by a user of model definition device 200 and/or for use by another application. For example, output interface 204 may interface with various output technologies including, but not limited to, display 216, a speaker 218, a printer 220, etc. Model definition device 200 may have one or more output interfaces that use the same or a different output interface technology. The output interface technology further may be accessible by model definition device 200 through communication interface 206.

Communication interface 206 provides an interface for receiving and transmitting data between devices using various protocols, transmission technologies, and media as understood by those skilled in the art. Communication interface 206 may support communication using various transmission media that may be wired and/or wireless. Model definition device 200 may have one or more communication interfaces that use the same or a different communication interface technology. For example, model definition device 200 may support communication using an Ethernet port, a Bluetooth antenna, a telephone jack, a USB port, etc. Data and messages may be transferred between model definition device 200 and/or distributed systems 232, one or more drilling operation sensors 226, and/or one or more drilling operation control parameters 228 of the plurality of drilling rigs 101 using communication interface 206.

Computer-readable medium 208 is an electronic holding place or storage for information so the information can be accessed by processor 210 as understood by those skilled in the art. Computer-readable medium 208 can include, but is not limited to, any type of random access memory (RAM), any type of read only memory (ROM), any type of flash memory, etc. such as magnetic storage devices (e.g., hard disk, floppy disk, magnetic strips, . . . ), optical disks (e.g., compact disc (CD), digital versatile disc (DVD), . . . ), smart cards, flash memory devices, etc. Model definition device 200 may have one or more computer-readable media that use the same or a different memory media technology. For example, computer-readable medium 208 may include different types of computer-readable media that may be organized hierarchically to provide efficient access to the data stored therein as understood by a person of skill in the art. As an example, a cache may be implemented in a smaller, faster memory that stores copies of data from the most frequently/recently accessed main memory locations to reduce an access latency. Model definition device 200 also may have one or more drives that support the loading of a memory media such as a CD, DVD, an external hard drive, etc. One or more external hard drives further may be connected to model definition device 200 using communication interface 206.

Processor 210 executes instructions as understood by those skilled in the art. The instructions may be carried out by a special purpose computer, logic circuits, or hardware circuits. Processor 210 may be implemented in hardware and/or firmware. Processor 210 executes an instruction, meaning it performs/controls the operations called for by that instruction. The term "execution" is the process of running an application or the carrying out of the operation called for by an instruction. The instructions may be written using one or more programming language, scripting language, assembly language, etc. Processor 210 operably couples with input interface 202, with output interface 204, with communication interface 206, and with computer-readable medium 208 to receive, to send, and to process information. Processor 210 may retrieve a set of instructions from a permanent memory device and copy the instructions in an executable form to a temporary memory device that is generally some form of RAM. Model definition device 200 may include a plurality of processors that use the same or a different processing technology.

Model definition application 222 performs operations associated with defining predictive model 224 for one or more drilling operations from data stored in data warehouse 112. Some or all of the operations described herein may be embodied in model definition application 222. The operations may be implemented using hardware, firmware, software, or any combination of these methods. Referring to the example embodiment of FIG. 2, model definition application 222 is implemented in software (comprised of computer-readable and/or computer-executable instructions) stored in computer-readable medium 208 and accessible by processor 210 for execution of the instructions that embody the operations of model definition application 222. Model definition application 222 may be written using one or more programming languages, assembly languages, scripting languages, etc.

Model definition application 222 may be implemented as a Web application. For example, model definition application 222 may be configured to receive hypertext transport protocol (HTTP) responses and to send HTTP requests. The HTTP responses may include web pages such as hypertext markup language (HTML) documents and linked objects generated in response to the HTTP requests. Each web page may be identified by a uniform resource locator (URL) that includes the location or address of the computing device that contains the resource to be accessed in addition to the location of the resource on that computing device. The type of file or resource depends on the Internet application protocol such as the file transfer protocol, HTTP, H.323, etc. The file accessed may be a simple text file, an image file, an audio file, a video file, an executable, a common gateway interface application, a Java applet, an extensible markup language (XML) file, or any other type of file supported by HTTP.

Data warehouse 112 may be stored in computer-readable medium 208 or on one or more computing devices (e.g., distributed systems 232) and accessed using communication interface 206. The data stored in data warehouse 112 may be received from the one or more drilling operation sensors 226. Example sensors include pressure sensors, temperature sensors, position sensors, velocity sensors, acceleration sensors, flow rate sensors, etc. that may be mounted to various components used as part of the drilling operation. For example, the one or more drilling operation sensors 226 may include surface and/or downhole sensors that measure a flow-in rate, a flow-out rate, a surface pressure, a downhole pressure, a differential pressure, a bit diameter, a fluid temperature, a fluid density, a fluid tank volume, a mud rheology property, a rate of penetration, a torque, a rotation speed of a drill pipe, a rotation speed of a drill bit, etc. Other data may be generated using physical models such as an earth model, a weather model, a seismic model, a bottom hole assembly model, a well plan model, an annular friction model, etc. In addition to sensor data, predicted outputs, of for example, a flow back measure such as a flow back pressure, a flow back flow rate, a flow back volume, etc. may also be stored in the data warehouse in association with the sensor data, drilling operation control parameters 228 indicating a current value of a control parameter for the drilling operation, or other data.

The plurality of values may be measured from the same drilling operation, from one or more neighboring drilling operations, from one or more drilling operations with similar geological characteristics, from any of one or more drilling operations, etc. For example, a drilling operation in an environment with a similar permeability and porosity may be used. The plurality of values may result from control variable values chosen by an operator during a previous time period on the same or a different drilling operation.

The data stored in data warehouse 112 may include any type of content represented in any computer-readable format such as binary, alphanumeric, numeric, string, markup language, etc. The content may include textual information, graphical information, image information, audio information, numeric information, etc. that further may be encoded using various encoding techniques as understood by a person of skill in the art. Data warehouse 112 may be stored using various formats as known to those skilled in the art including a file system, a relational database, a system of tables, a structured query language database, etc. For example, data warehouse 112 may be stored in a cube distributed across a grid of computers as understood by a person of skill in the art. As another example, data warehouse 112 may be stored in a multi-node Hadoop® cluster, as understood by a person of skill in the art. Apache™ Hadoop® is an open-source software framework for distributed computing supported by the Apache Software Foundation. As another example, data warehouse 112 may be stored in a cloud of computers and accessed using cloud computing technologies, as understood by a person of skill in the art. The SAS® LASR™ Analytic Server developed and provided by SAS Institute Inc. of Cary, N.C., USA may be used as an analytic platform to enable multiple users to concurrently access data stored in data warehouse 112.

If data warehouse 112 is distributed across distributed systems 232, a distributed processing system can be used. For example, the distributed processing system may be implemented using a multi-node Hadoop® cluster, using a grid of computers storing a cube of data, using the SAS® LASR™ Analytic Server, using cloud of computers, etc. as understood by a person of skill in the art. For example, a distributed control device may coordinate access to data warehouse 112 distributed across distributed systems 232 when requested by model definition device 200. One or more components of the distributed processing system may support multithreading, as understood by a person of skill in the art. The components of the distributed processing system may be located in a single room or adjacent rooms, in a single facility, and/or may be distributed geographically from one another.

The data in data warehouse 112 may be cleansed to impute missing values, smooth noisy data, identify and remove outliers, and/or resolve inconsistencies as understood by a person of skill in the art. The data in data warehouse 112 may be transformed to normalize and aggregate the data, to unify data formats such as dates, and to convert nominal data types to numeric data types as understood by a person of skill in the art.

Figure 3:
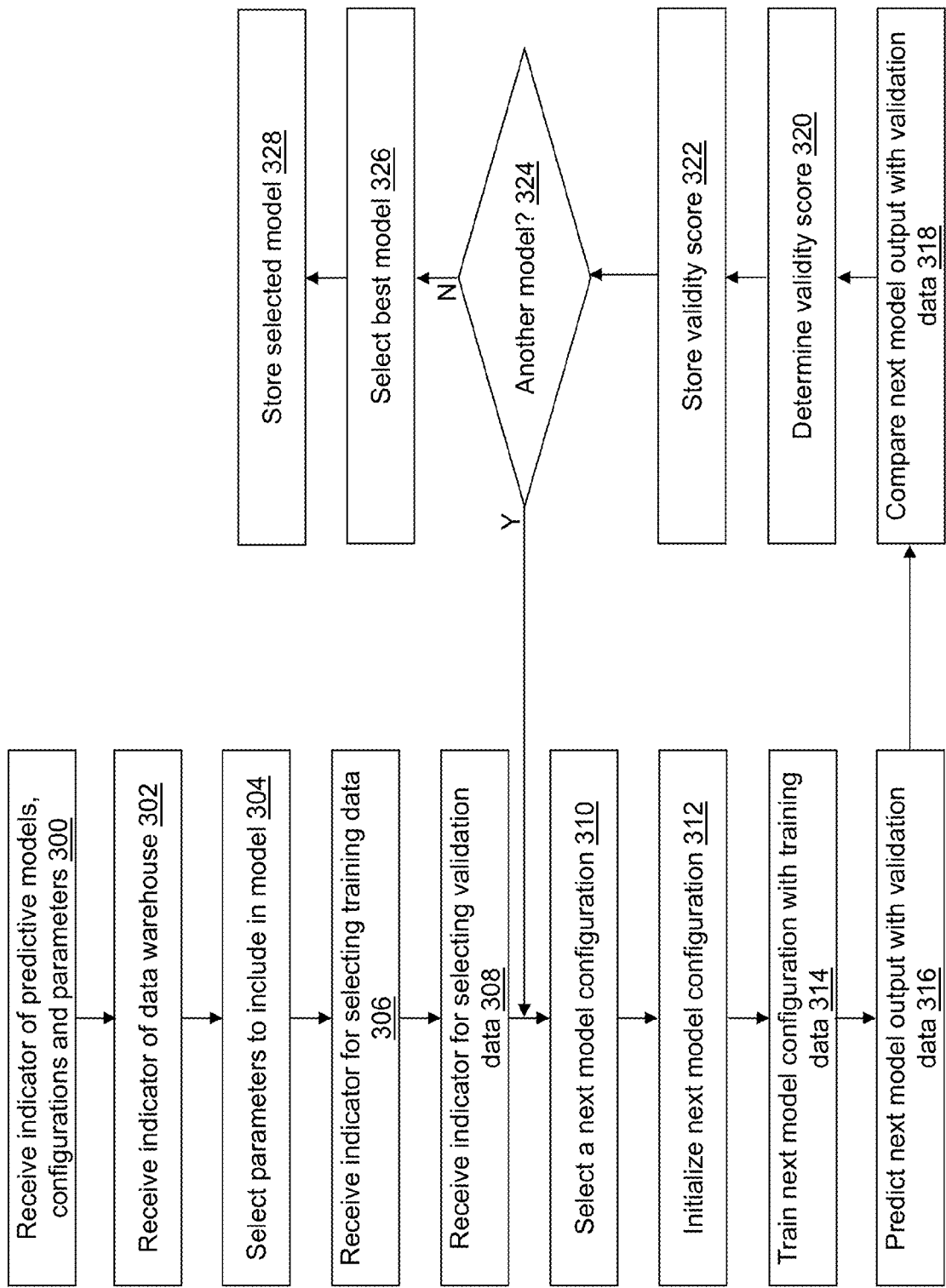
FIG. 3 depicts a flow diagram illustrating examples of operations performed by the model definition device of FIG. 2 in accordance with an illustrative embodiment.

Referring to FIG. 3, example operations associated with model definition application 222 are described. Model definition application 222 may be used to create one or more predictive model 224 using the data stored in data warehouse 112. Predictive model 224 supports a determination of a predicted value for the flow back measure, such as the flow back pressure, the flow back flow rate, the flow back volume, etc., using sensed data measured during the drilling operation by the one or more drilling operation sensors 226 and/or using control settings read for the one or more drilling operation control parameters 228 of the drilling operation.

Additional, fewer, or different operations may be performed depending on the embodiment. The order of presentation of the operations of FIG. 3 is not intended to be limiting. Although some of the operational flows are presented in sequence, the various operations may be performed in various repetitions, concurrently (in parallel, for example, using threads), and/or in other orders than those that are illustrated. For example, a user may execute model definition application 222, which causes presentation of a first user interface window, which may include a plurality of menus and selectors such as drop down menus, buttons, text boxes, hyperlinks, etc. associated with model definition application 222 as understood by a person of skill in the art. An indicator may indicate one or more user selections from a user interface, one or more data entries into a data field of the user interface, one or more data items read from computer-readable medium 208 or otherwise defined with one or more default values, etc. that are received as an input by model definition application 222.

In an operation 300, a first indicator of one or more types of predictive models and configurations is received. For example, the first indicator indicates a name of a type of predictive model and one or more flow back measures, such as the flow back pressure, the flow back flow rate, the flow back volume, etc., to predict. One or more types of predictive models and configurations for one or more flow back measures further may be defined for one or more types of geological strata. A name of a type of predictive model may be selectable for each of the one or more types of geological strata. A name of a type of predictive model further may be selectable for one or more of the flow back measures.

For illustration, the name of a type of predictive model may be "Neural Network", "Linear Regression", "Non-linear Regression", "Support Vector Machine", "Decision Tree", "Partial Least Squares", "Gradient Boosting", etc. A configuration identifies one or more initialization values based on the type of predictive model. For example, when the type of predictive model is indicated as "Neural Network", a number of hidden layers, a number of nodes per layer, a propagation method, etc. may be identified by the first indicator. A plurality of configurations may be defined. For example, when the type of predictive model is neural network, a range of numbers of hidden layers, a range of numbers of nodes per layer, etc. also may be identified by the first indicator.

For further illustration, the data in data warehouse 112 may be provided to SAS® Enterprise Miner™ for predictive modeling developed and provided by SAS Institute Inc. of Cary, N.C., USA. As an example, SAS® Enterprise Miner™ includes types of predictive models for neural networks (AutoNeural, DMNeural, Neural Network), decision trees (Decision Tree, Gradient Boosting), regression models (Dmine Regression, Least Angle Regressions (LARS), Regression), k-nearest neighbors models (Memory Based Reasoning (MBR)), a partial least squares model (Partial Least Squares), a support vector machine (Support Vector Machine), an ensemble of models that are integrated to define a predictive model (Ensemble), etc.

The first indicator may be received by model definition application 222 after selection from a user interface window or after entry by a user into a user interface window. A default value for the types of predictive models and configurations, and the one or more types of geological strata may further be stored, for example, in computer-readable medium 208. In an alternative embodiment, the types of predictive models and configurations, and the one or more types of geological strata may not be selectable.

In an operation 302, a second indicator of data warehouse 112 is received. For example, the second indicator indicates a location of data warehouse 112. As an example, the second indicator may be received by model definition application 222 after selection from a user interface window or after entry by a user into a user interface window. In an alternative embodiment, data warehouse 112 may not be selectable. For example, a most recently created data warehouse may be used automatically.

As discussed previously, data warehouse 112 may be stored in a cube distributed across a grid of computers, may be stored in a multi-node Hadoop® cluster distributed across one or more computers, may be stored in a file system distributed across one or more computers, in a relational database, in one or more tables, in a structured query language database, etc.

In an operation 304, the data stored in data warehouse 112 is explored and mined to select input variables significant to a determination of a predictive model for one or more of the flow back measures and/or the one or more types of geological strata. For example, in operation 304, the data stored in data warehouse 112 is reduced to obtain a minimal representation in dimension and volume as well as to retain a consistent variance and entropy for similar analytical results. Numerical data types may be discretized as understood by a person of skill in the art to simplify analytic processing.

Example data mining techniques include factor analysis, principal component analysis, correlation analysis, etc. as understood by a person of skill in the art. For illustration, SAS® Enterprise Miner™, developed and provided by SAS Institute Inc. of Cary, N.C., USA, includes nodes for exploring data and selecting or modifying control variables as input variables. Examples nodes include transformation nodes, clustering nodes, association rule nodes, a variable selection node, a descriptive statistics node, a principal components node, etc.

For example, the input variables with a highest degree of correlation relative to predicting each of the one or more flow back measures and/or the one or more types of geological strata may be selected. Example input variables include a flow-in rate variable, a flow-out rate variable, a surface pressure variable, a downhole pressure variable, a differential pressure variable, a bit diameter variable, a fluid temperature variable, a fluid density variable, a fluid tank volume variable, a mud rheology property variable, a rate of penetration variable, a torque variable, a surface rotation speed variable measured by a surface drilling control system, a drill bit rotation speed variable calculated from fluid flow rates through a mud motor, etc.

In an operation 306, a third indicator for selecting training data for the predictive model from data warehouse 112 is received. The third indicator may be received by model definition application 222, for example, after selection from a user interface window or after entry by a user into a user interface window. The third indicator identifies a first portion of the data stored in data warehouse 112 to use in training the predictive model. The third indicator may indicate a number of data points to include, a percentage of data points of the entire data warehouse 112 to include, etc. A subset may be created from data warehouse 112 by sampling. An example sampling algorithm is uniform sampling. Other random sampling algorithms may be used.

In an operation 308, a fourth indicator for selecting validation data for the predictive model from data warehouse 112 is received. The fourth indicator may be received by model definition application 222, for example, after selection from a user interface window or after entry by a user into a user interface window. The fourth indicator identifies a second portion of the data stored in data warehouse 112 to use in validating the predictive model. The fourth indicator may indicate a number of data points to include, a percentage of data points of the entire data warehouse 112 to include, etc. A subset may be created from data warehouse 112 by sampling. An example sampling algorithm is uniform sampling. Other random sampling algorithms may be used. The data points from data warehouse 112 selected for the validation data may be distinct from the data points from data warehouse 112 selected for the training data.

In an operation 310, a predictive model is selected based on the first indicator or based on a default model stored in computer-readable medium 208. In an operation 312, the selected predictive model is initialized. In an operation 314, the initialized predictive model is trained using the training data selected as indicated by the third indicator.

In an operation 316, output data is predicted with the validation data, selected as indicated by the fourth indicator, as an input to the trained predictive model. In an operation 318, the predicted output data is compared to the actual output data included with the validation data. In an operation 320, a validity score is determined based on the comparison. In an operation 322, the determined validity score is stored, for example, in computer-readable medium 208 in association with an indicator of the selected predictive model.

In an operation 324, a determination is made concerning whether or not there is another predictive model to evaluate. When there is another predictive model to evaluate, processing continues in operation 310. When there is not another predictive model to evaluate, processing continues in an operation 326. In operation 310, a next predictive model is selected based on the first indicator.

In operation 326, a best predictive model for each of one or more specific drilling location, specific drilling field, specific type of drilling environment, type of flow back measure indicator, type of geological indicator, etc. is selected. For example, the validity scores stored for each iteration of operation 322 are compared and the predictive model associated with the best validity score is selected. The best validity score may be a minimum or a maximum value of the validity scores stored for each iteration of operation 322. For example, if the validity score is a misclassification rate, a minimum validity score indicates the best model; whereas, if the validity score is a correct classification rate, a maximum validity score indicates the best model.

In an operation 328, the selected best predictive model is stored, for example, in computer-readable medium 208. The selected predictive model may be stored in association with a specific drilling location, a specific drilling field, a specific type of drilling environment, a type of flow back measure indicator, a type of geological indicator, etc. The selected predictive model is stored as predictive model 224. A different predictive model 224 may be defined for each specific drilling location, specific drilling field, specific type of drilling environment, type of flow back measure indicator, and type of geological indicator, etc.

Figure 4:
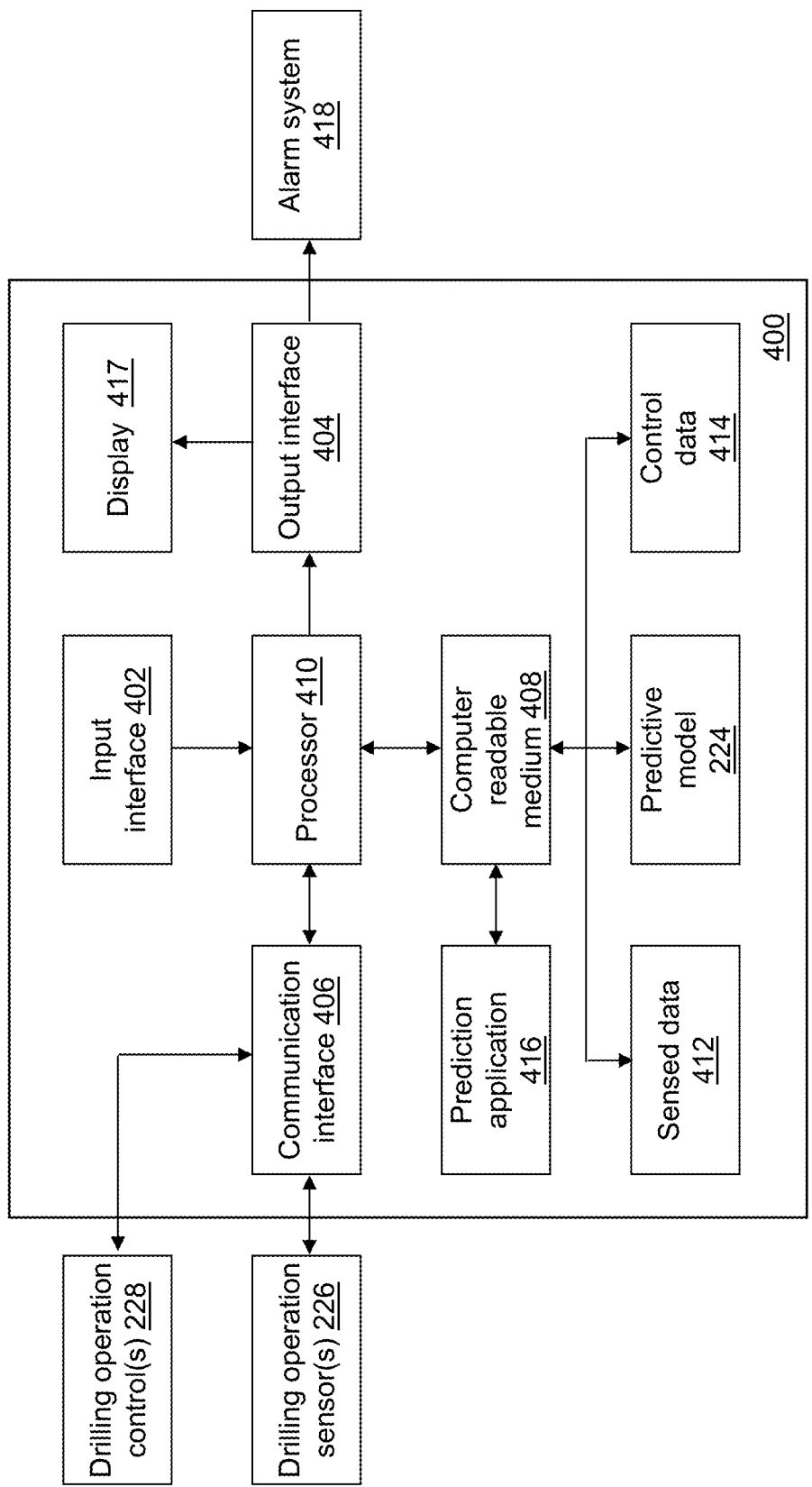
FIG. 4 depicts a further block diagram of a prediction device in accordance with an illustrative embodiment.

Referring to FIG. 4, a block diagram of a prediction device 400 is shown in accordance with an illustrative embodiment. Prediction device 400 may include a second input interface 402, a second output interface 404, a second communication interface 406, a second computer-readable medium 408, a second processor 410, predictive model 224, sensed data 412, control data 414, prediction application 416, and a second display 417. Fewer, different, and/or additional components may be incorporated into prediction device 400.

After being selected using model definition device 200, predictive model 224 may be stored in second computer-readable medium 408 and/or accessed by prediction device 400 through second communication interface 406. Model definition device 200 and prediction device 400 may be integrated into the same computing device. Model definition device 200 and prediction device 400 may be different computing devices. Prediction device 400 may be located on a drilling rig of the plurality of drilling rigs 101 or remote from the plurality of drilling rigs 101. Prediction device 400 may be located on a drilling rig different from the plurality of drilling rigs 101 from which data is stored in data warehouse 112.

Data generated by prediction device 400 may be stored in data warehouse 112 through second communication interface 406.

Second input interface 402 provides the same or similar functionality as that described with reference to input interface 202 of model definition device 200 though referring to prediction device 400. Second output interface 404 provides the same or similar functionality as that described with reference to output interface 204 of model definition device 200 though referring to prediction device 400. Second communication interface 406 provides the same or similar functionality as that described with reference to communication interface 206 of model definition device 200 though referring to prediction device 400. Data and messages may be transferred between prediction device 400 and drilling operation control(s) 228 and/or drilling operation sensor(s) 226 using second communication interface 406. Data and messages may be transferred between prediction device 400 and drilling operation control(s) 228 and/or drilling operation sensor(s) 226 using second input interface 402 and/or second output interface 404. Second computer-readable medium 408 provides the same or similar functionality as that described with reference to computer-readable medium 208 of model definition device 200 though referring to prediction device 400. Second processor 410 provides the same or similar functionality as that described with reference to processor 210 of model definition device 200 though referring to prediction device 400.

Prediction application 416 supports a determination of a predicted value for one or more flow back measure based on one or more type of geological strata of the drilling operation using sensed data 412 measured during the drilling operation and control data 414 generated during the drilling operation. Prediction application 416 may be executed for each connection event that occurs during the drilling operation. Some or all of the operations described herein may be embodied in prediction application 416. The operations of prediction application 416 may be implemented using hardware, firmware, software, or any combination of these methods. Referring to the example embodiment of FIG. 4, prediction application 416 is implemented in software (comprised of computer-readable and/or computer-executable instructions) stored in second computer-readable medium 408 and accessible by second processor 410 for execution of the instructions that embody the operations of prediction application 416. Prediction application 416 may be written using one or more programming languages, assembly languages, scripting languages, etc. Prediction application 416 may be implemented as a Web application.

Referring to FIG. 5, example operations associated with prediction application 416 are described. For example, the example operations may be performed upon occurrence of a connection event to monitor a fluid flow back measure during the event. Additional, fewer, or different operations may be performed depending on the embodiment. The order of presentation of the operations of FIG. 5 is not intended to be limiting. Although some of the operational flows are presented in sequence, the various operations may be performed in various repetitions, concurrently (in parallel, for example, using threads), and/or in other orders than those that are illustrated.

In an operation 500, a value of a confidence level is received. The confidence level indicates a certainty that a current fluid flow back measurement falls within what is considered an expected variability of the actual flow back as compared to a predicted flow back. As an example, a confidence level of 5% would establish that an actual fluid flow back response greater than 2.5% of the predicted flow back at a given point in time triggers an alarm using alarm system 418. As an example, the confidence level value may be entered or selected by a user and received by prediction application 416. For illustration, the confidence level value may be received after interaction by the user with a user interface window. For example, a numerical value is received that indicates a user selection of the value to be used for the confidence level. For further illustration, instead of receiving a user selection, a default value for the confidence level may be stored in second computer-readable medium 408 and received by retrieving the value from the appropriate memory location as understood by a person of skill in the art.

In an operation 502, a geological indicator is received. The geological indicator indicates a type of the current geology of the drilling operation to use for a current prediction of the one or more flow back measures. For example, the geological indicator may indicate sandstone, dolomite, limestone, shale, etc. As an example, the geological indicator may be entered or selected by a user and received by prediction application 416. For illustration, the geological indicator may be received after interaction by the user with a user interface window. For example, a numerical or alphanumeric value is received that indicates a user selection of the geological indicator. For further illustration, instead of receiving a user selection, a default value for the geological indicator may be stored in second computer-readable medium 408 and received by retrieving the value from the appropriate memory location as understood by a person of skill in the art.

In an operation 504, sensed data 412 and/or control data 414 is received. For example, control data 414 and sensed data 412 associated with the input variables indicated in operation 304 are received from data warehouse 112. The control data 414 and sensed data 412 may have been recorded during a previous connection event of the drilling operation such as during a last drilled stand of drillpipe.

In an operation 506, values of the one or more flow back values of the drilling operation are predicted as a function of time by executing the selected predictive model 224 defined for the geological indicated by the geological indicator with the control data 414 and sensed data 412 received in operation 504 as an input.

Figure 6B:
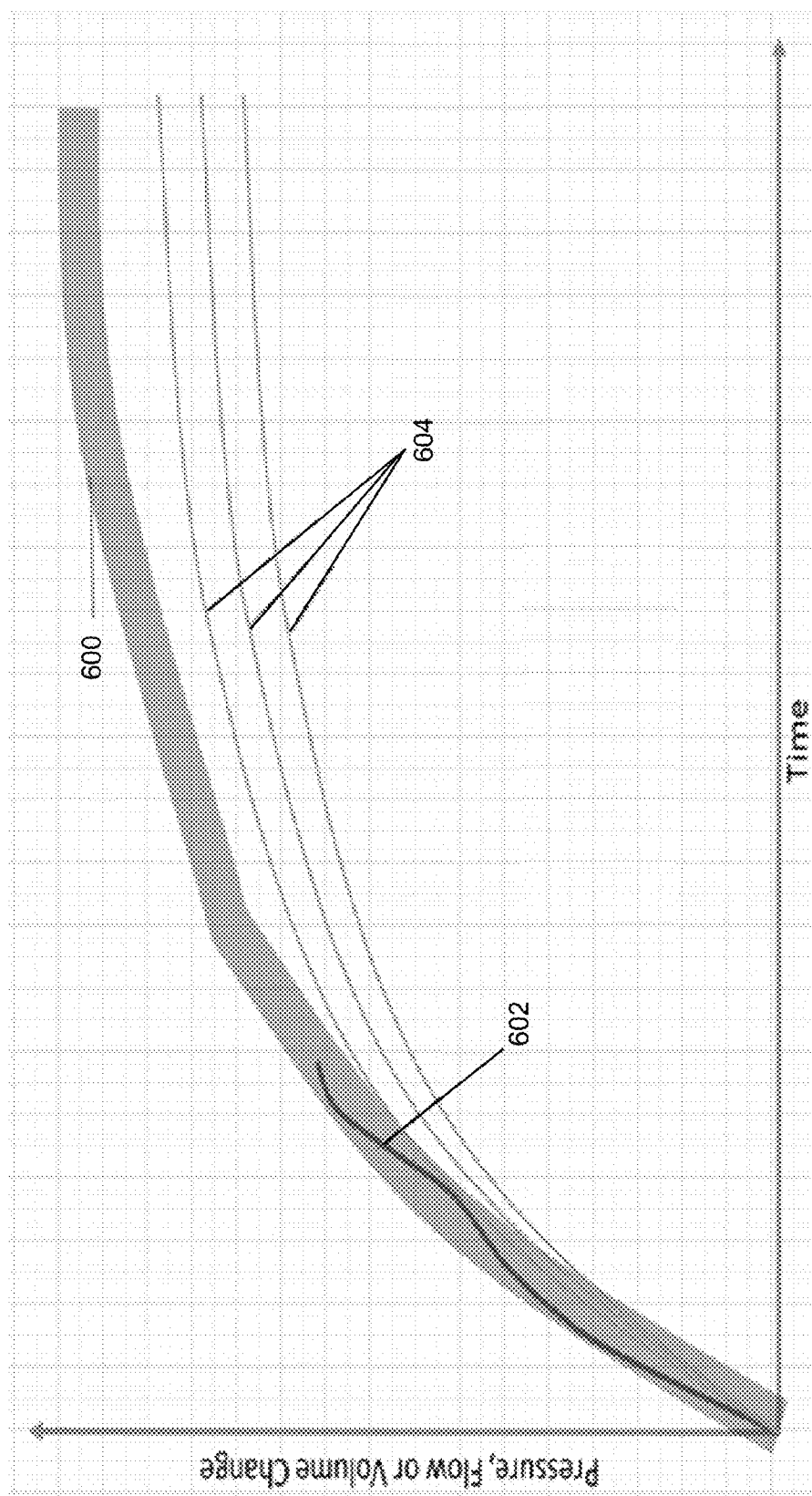

In an operation 508, the predicted values of the one or more flow back values of the drilling operation are output. For example, the predicted values may be output to second display 417 for review by a user and/or output to second computer-readable medium 408. For illustration, referring to FIG. 6a, the predicted values of the one or more flow back values of the drilling operation are represented by an acceptable fluid flow back band 600 shown in accordance with an illustrative embodiment. Acceptable fluid flow back band 600 indicates the predicted values of the one or more flow back values of the drilling operation as a function of time and has a width that is defined by the received confidence level value. A flow back measurement that falls outside the width of alarm limit band 600 may be abnormal and worthy of further investigation or response by drilling personnel. A maximum curve of alarm limit band 600 is defined as $P_v + P_v C_l/2$, where $P_v$ is the predicted value at each time point and $C_l$ is a numeric value of the confidence level. A minimum curve of alarm limit band 600 is defined as $P_v - P_v C_l/2$.

In an operation 510, flow back measurement data is received from sensed data 412 in or near real-time. In an operation 512, the received flow back measurement data is output. For example, the received flow back measurement data may be output to second display 417 for review by a user and/or output to second computer-readable medium 408. For illustration, referring to FIG. 6b, the received flow back measurement data is represented by flow back measurement curve 602 shown in accordance with an illustrative embodiment. Previous flow back curves 604 also may be output. Previous flow back curves 604 may indicate what the fluid flow back response was during one or more previous connection event. For example, previous flow back curves 604 show the previous flow back as a function of time during three previous connection events.

Figure 10B:
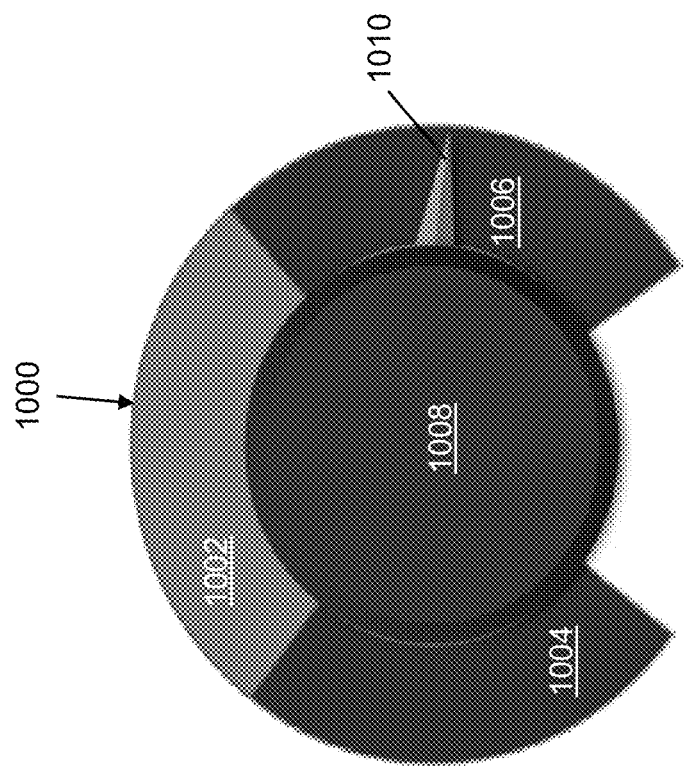
FIGS. 10a and 10b depict a fluid flow back status indicator in accordance with an illustrative embodiment.
Figure 10A:
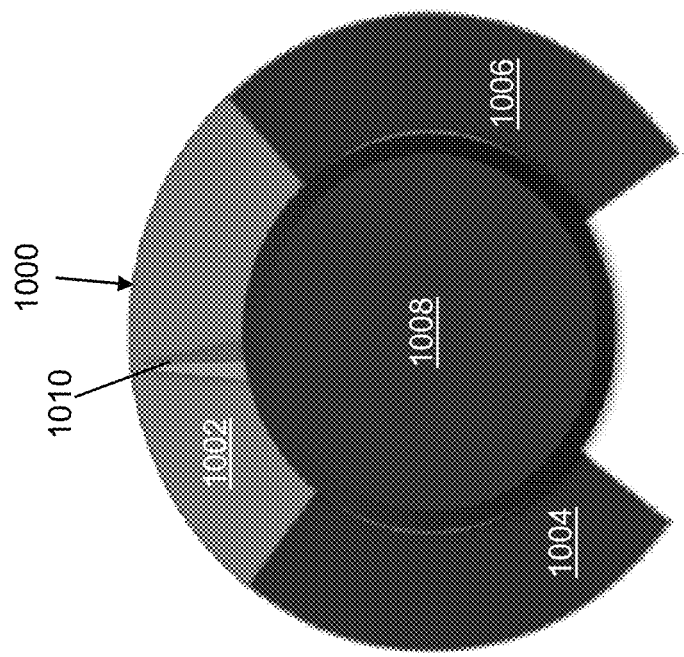

As another example, referring to FIG. 10a, a fluid flow back status indicator 1000 is shown in accordance with an illustrative embodiment. Fluid flow back status indicator 1000 may be output to second display 417 for review by a user. In the illustrative embodiment, fluid flow back status indicator 1000 is in the form of a dial. Fluid flow back status indicator 1000 may include a first semicircular region 1002, a second semicircular region 1004, a third semicircular region 1006, a center region 1008, and a value indicator 1010. Fluid flow back status indicator 1000 may include a greater or a fewer number of regions.

First semicircular region 1002 defines an acceptable fluid flow back region. Second semicircular region 1004 defines a less than acceptable fluid flow back region. Third semicircular region 1006 defines a greater than acceptable fluid flow back region. Each region may include a different color or shading. For example, first semicircular region 1002 may be green. Second semicircular region 1004 and third semicircular region 1006 may be red.

First semicircular region 1002 is positioned at a top of center region 1008 between second semicircular region 1004 and third semicircular region 1006. Second semicircular region 1004 is positioned to the left of first semicircular region 1002. Third semicircular region 1006 is positioned to the right of first semicircular region 1002.

In the illustrative embodiment, value indicator 1010 is a pointer that can be positioned at a location within one of first semicircular region 1002, second semicircular region 1004, and third semicircular region 1006 based on a value of the received flow back measurement datum at a specific time point. A position of value indicator 1010 around center region 1008 may indicate how close the value for the received flow back measurement datum is to $P_v$ at that time point. A position of value indicator 1010 in a left side of center region 1008 may indicate that the value for the received flow back measurement datum is less than $P_v$ at that time point. A position of value indicator 1010 in a right side of center region 1008 may indicate that the value for the received flow back measurement datum is greater than $P_v$ at that time point.

A position of value indicator 1010 within first semicircular region 1002 indicates that the value for the received flow back measurement datum is within $P_v \pm P_v C_l/2$. A position of value indicator 1010 straight up within first semicircular region 1002 indicates that the value for the received flow back measurement datum is $\sim P_v$. A position of value indicator 1010 within second semicircular region 1004 indicates that the value for the received flow back measurement datum is less than $P_v - P_v C_l/2$. A position of value indicator 1010 within third semicircular region 1006 indicates that the value for the received flow back measurement datum is greater than $P_v + P_v C_l/2$.

A location of value indicator 1010 may be updated when each time point is added to flow back measurement curve 602. A color or a shading of center region 1008 may be changed to match the color or the shading of the semicircular region in which value indicator 1010 is positioned.

In an operation 514, the received flow back measurement data is compared to the predicted values. In an operation 516, a determination is made concerning whether alarm system 418 should be triggered to issue an alarm. If alarm system 418 should not be triggered to issue an alarm, processing continues in an operation 520. If alarm system 418 should be triggered to issue an alarm, processing continues in an operation 518.

Figure 6C:
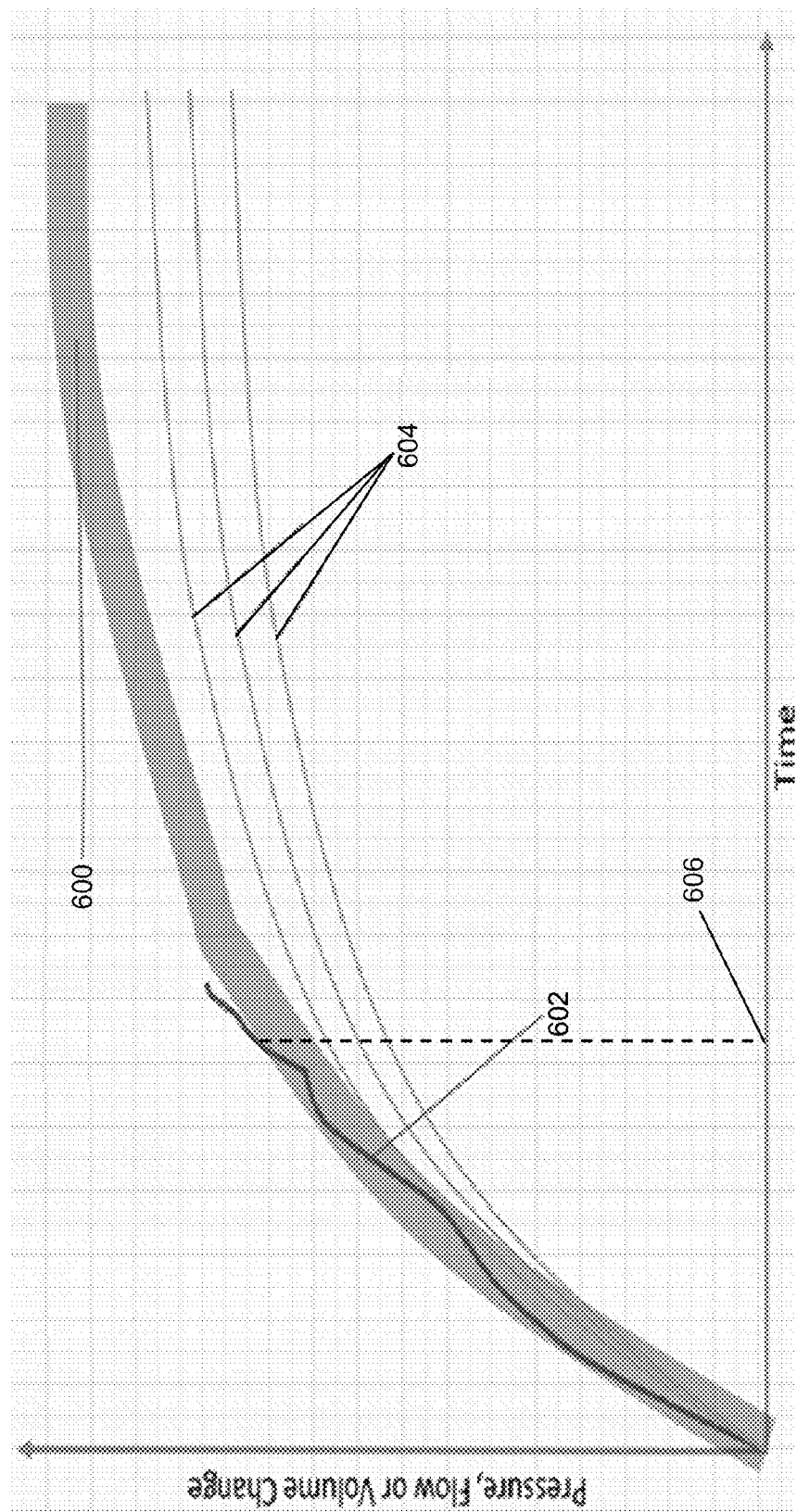

The determination may be based on the received flow back measurement data exceeding the predicted values by more than half the confidence level value. For illustration, referring to FIG. 6c, the received flow back measurement data is represented by flow back curve 602 shown at a later point in time. An alarm may be triggered at time point 606 based on the received flow back measurement data exceeding the maximum curve of acceptable fluid flow back band 600. Exceeding the maximum curve of acceptable fluid flow back band 600 may be evidence of a fluid influx from the geology indicating a potential well kick.

In operation 518, alarm system 418 is triggered to issue an alarm. For example, alarm system 418 may include a speaker through which an alarm message is sounded. As another example, an alarm indicator may be triggered on second display 417. For example, referring to FIG. 10b, fluid flow back status indicator 1000 may be updated at time point 606 to show value indicator 1010 in third semicircular region 1006 indicating that the value for the received flow back measurement datum at time point 606 exceeds $P_v + P_v C_l/2$. In the illustrative embodiment, the color or the shading of center region 1008 may be changed to match the color or the shading of third semicircular region 1006 to further alert the user to a potential well kick.

In an operation 520, a determination is made concerning whether a change to predictive model 224 is performed. If the determination is to perform a change, processing continues in an operation 522 to update or change one or more of the models. If the determination is not to perform a change, processing continues in operation 510 to continue to process sensed data 412 as it is received in or near real-time and to monitor the received flow back measurement data.

An indicator may be received indicating that a change or an update to one or more of the models be performed. For example, predictive model 224 may be updated periodically such as every second, minute, hour, day, week, month, year, etc. A timer may trigger receipt of the indicator. A user may trigger receipt of the indicator. As another example, predictive model 224 may be changed when a predominant geological value for the open hole section of the wellbore changes.

In operation 522, the one or more models are updated. For example, the one or more models may be updated by updating the data stored in data warehouse 112 and repeating one or more of operations 302 to 328 for predictive model 224. For example, operations 310 to 328 may be repeated. The data stored in data warehouse 112 in a previous iteration of operation 328, in addition to data measured and stored in data warehouse 112 subsequent to the last iteration of operation 328, may be used to update the one or more models. As another example, predictive model 224 may be updated to use a predictive model 224 associated with the change in the predominant geology for the open hole section of the wellbore.

Figure 7:
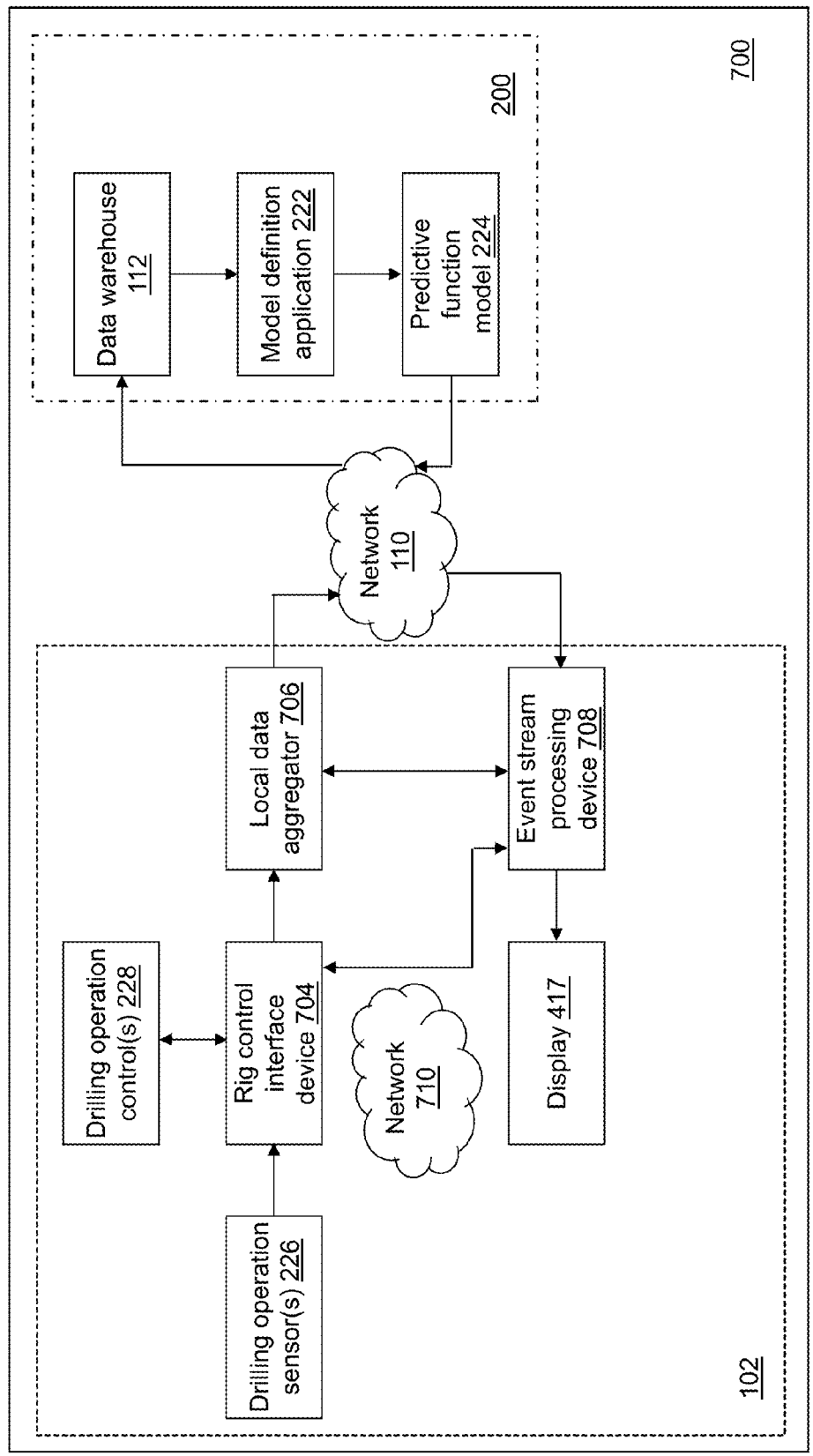
FIG. 7 depicts a block diagram of a distributed processing system in accordance with an illustrative embodiment.

Referring to FIG. 7, a block diagram of a drilling system 700 is shown in accordance with an illustrative embodiment. Drilling system 700 may include first drilling rig 102, network 110, and model definition device 200. Fewer, different, and/or additional components may be incorporated into drilling system 700. First drilling rig 102 may include the drilling operation sensors 226, the drilling operation control parameters 228 that generate control data 414, a rig control interface device 704, a local data aggregator 706, an event stream processing (ESP) device 708, second display 417, and a second network 710. Rig control interface device 704 may be configured to receive data from the drilling operation sensors 226 and the drilling operation control parameters 228. The received data may be aggregated on pre-existing rig aggregators such as local data aggregator 706 as understood by a person of skill in the art.

Second network 710 may include one or more networks of the same or different types. Second network 710 can be any type or combination of wired and/or wireless public or private network including a cellular network, a local area network, a wide area network such as the Internet, etc. Second network 710 further may comprise sub-networks and consist of any number of devices. Though connections through second network 710 are not explicitly shown in the illustrative embodiment of FIG. 7, one or more of the components of drilling system 700 may communicate using second network 710 that includes various transmission media that may be wired and/or wireless as understood by those skilled in the art. One or more of the components of drilling system 700 may be directly connected or integrated into one or more computing devices.

Figure 8:
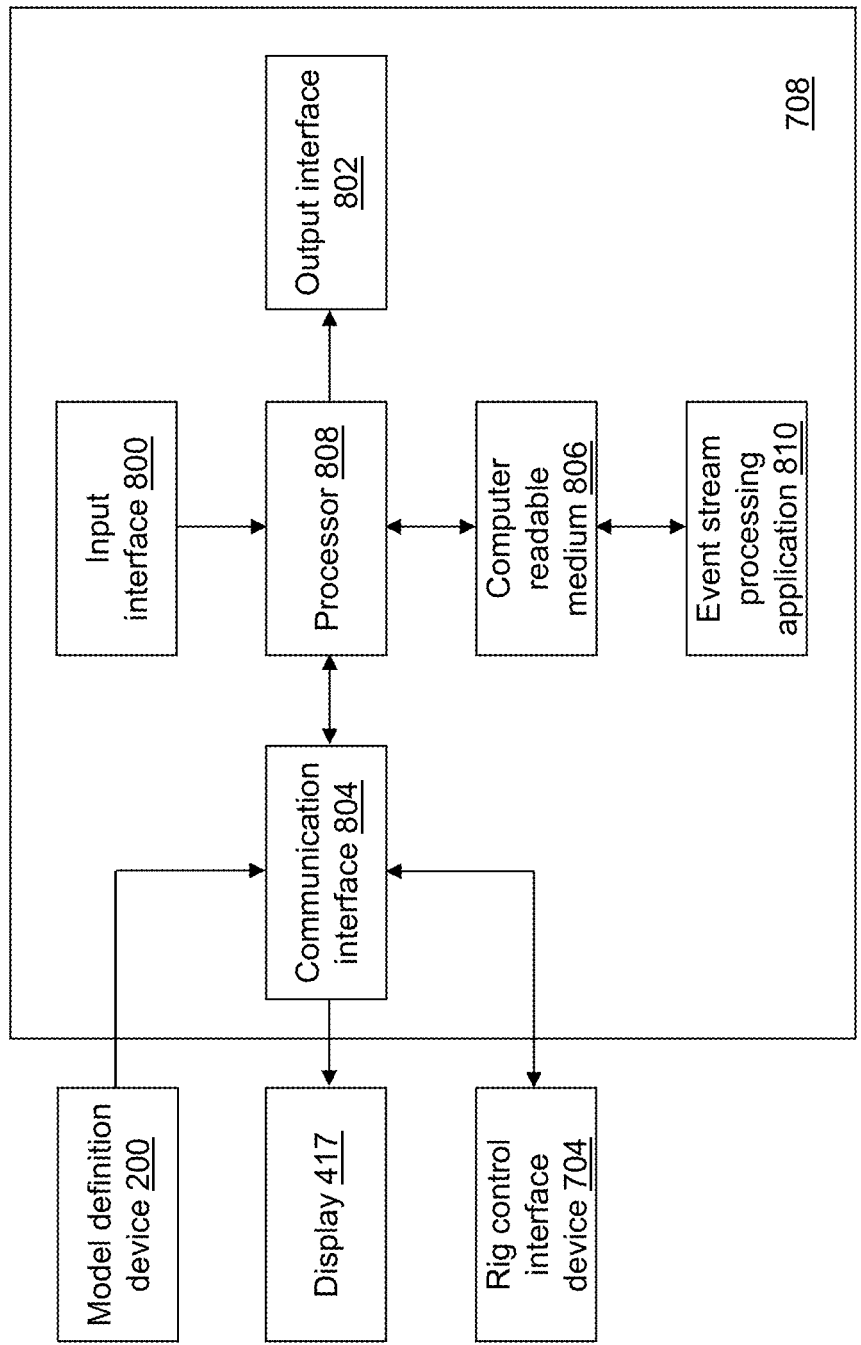
FIG. 8 depicts a block diagram of an event stream processing (ESP) device of the distributed processing system of FIG. 7 in accordance with an illustrative embodiment.

Referring to FIG. 8, a block diagram of ESP device 708 is shown in accordance with an illustrative embodiment. ESP device 708 may include a third input interface 800, a third output interface 802, a third communication interface 804, a third computer-readable medium 806, a third processor 808, and an ESP application 810. Fewer, different, and/or additional components may be incorporated into ESP device 708.

Third input interface 800 provides the same or similar functionality as that described with reference to input interface 202 of model definition device 200 though referring to ESP device 708. Third output interface 802 provides the same or similar functionality as that described with reference to output interface 204 of model definition device 200 though referring to ESP device 708. Third communication interface 804 provides the same or similar functionality as that described with reference to communication interface 206 of model definition device 200 though referring to ESP device 708. Data and messages may be transferred between ESP device 708 and model definition device 200, rig control interface device 704, and/or second display 417 using second communication interface 804. Third computer-readable medium 806 provides the same or similar functionality as that described with reference to computer-readable medium 208 of model definition device 200 though referring to ESP device 708. Third processor 808 provides the same or similar functionality as that described with reference to processor 210 of model definition device 200 though referring to ESP device 708.

ESP application 810 performs operations associated with executing the operations of prediction application 416 in or near real-time. Some or all of the operations described herein may be embodied in ESP application 810. The operations may be implemented using hardware, firmware, software, or any combination of these methods. Referring to the example embodiment of FIG. 8, ESP application 810 is implemented in software (comprised of computer-readable and/or computer-executable instructions) stored in third computer-readable medium 806 and accessible by third processor 808 for execution of the instructions that embody the operations of ESP application 810. ESP application 810 may be written using one or more programming languages, assembly languages, scripting languages, etc. ESP application 810 may be based on the Event Stream Processing Engine developed and provided by SAS Institute Inc. of Cary, N.C., USA.

Figure 9:
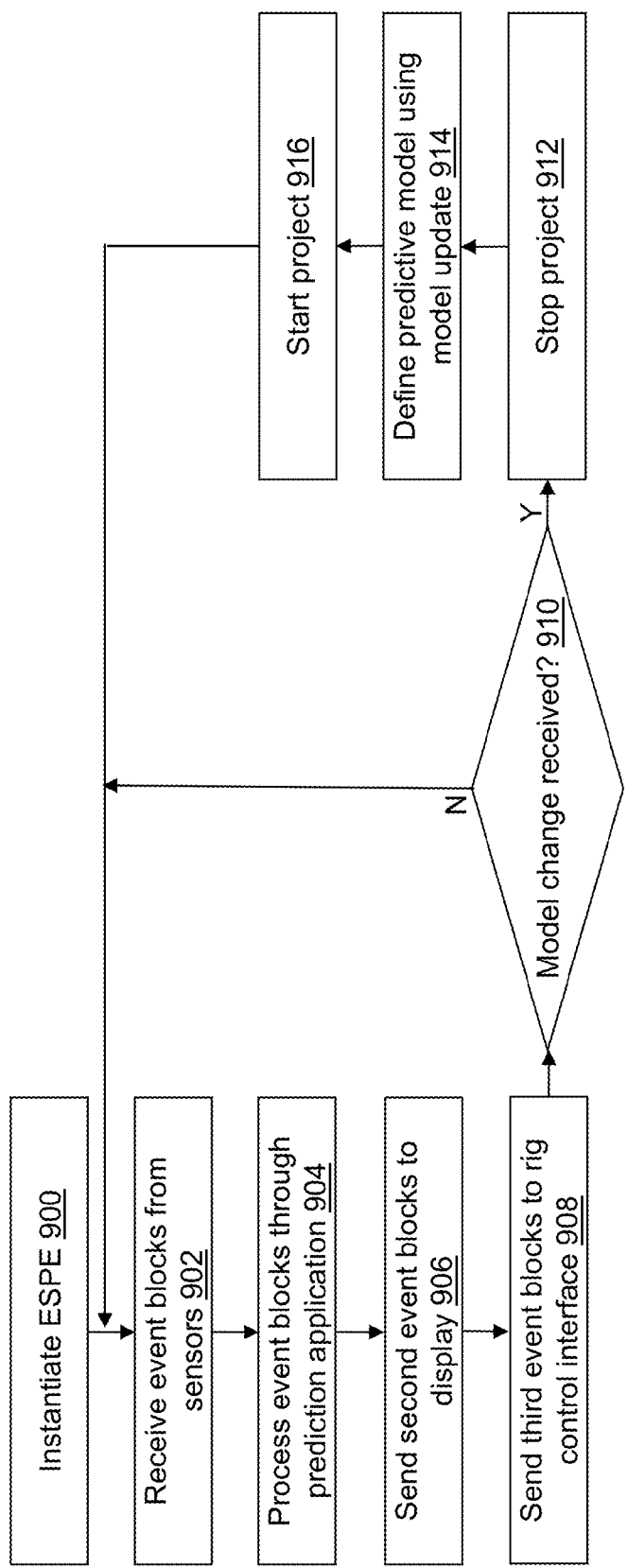
FIG. 9 depicts a flow diagram illustrating examples of operations performed by the ESP device of FIG. 8 in accordance with an illustrative embodiment.

Referring to FIG. 9, example operations associated with ESP application 810 are described. Additional, fewer, or different operations may be performed depending on the embodiment. The order of presentation of the operations of FIG. 9 is not intended to be limiting. Although some of the operational flows are presented in sequence, the various operations may be performed in various repetitions, concurrently (in parallel, for example, using threads), and/or in other orders than those that are illustrated.

In an operation 900, an ESP application instance is instantiated at ESP device 708. In an illustrative embodiment, an engine container is created, which instantiates an ESP engine (ESPE). The components of an ESPE executing at ESP device 708 may include one or more projects. A project may be described as a second-level container in a model managed by the ESPE where a thread pool size for the project may be defined by a user. The engine container is the top-level container in a model that manages the resources of the one or more projects. Each project of the one or more projects may include one or more continuous queries also referenced as a model. The one or more continuous queries may include one or more source windows and one or more derived windows. In an illustrative embodiment, for example, there can be only one ESPE for each instance of ESP application 810. ESPE may or may not be persistent.

Continuous query modeling involves defining directed graphs of windows for event stream manipulation and transformation. A continuous query may be described as a directed graph of source, relational, pattern matching, and procedural windows. The one or more source windows and the one or more derived windows represent continuously executing queries that generate updates to a query result set as new event blocks stream through ESPE.

An event object may be described as a packet of data accessible as a collection of fields, with at least one of the fields defined as a key or unique identifier (ID). The event object may be created using a variety of formats including binary, alphanumeric, XML, etc. Each event object may include one or more fields designated as a primary ID for the event so ESPE can support operation codes (opcodes) for events including insert, update, upsert, and delete. Upsert opcodes update the event if the key field already exists; otherwise, the event is inserted. For illustration, an event object may be a packed binary representation of a set of field values and include both metadata and field data associated with an event. The metadata may include an opcode indicating if the event represents an insert, update, delete, or upsert, a set of flags indicating if the event is a normal, partial-update, or a retention generated event from retention policy management, and a set of microsecond timestamps that can be used for latency measurements.

An event block object may be described as a grouping or package of event objects. An event stream may be described as a continuous flow of event block objects. A continuous query of the one or more continuous queries transforms a source event stream made up of streaming event block objects published into ESPE into one or more output event streams using the one or more source windows and the one or more derived windows. A continuous query can also be thought of as data flow modeling.

The one or more source windows are at the top of the directed graph and have no windows feeding into them. Event streams are published into the one or more source windows, and from there, the event streams are directed to the next set of connected windows as defined by the created drilling model. The one or more derived windows are all instantiated windows that are not source windows and that have other windows streaming events into them. The one or more derived windows perform computations or transformations on the incoming event streams. The one or more derived windows transform event streams based on the window type (that is operators such as join, filter, compute, aggregate, copy, pattern match, procedural, union, etc.) and window settings. As event streams are published into the ESPE, they are continuously queried, and the resulting sets of derived windows in these queries are continuously updated.

The one or more continuous queries are instantiated by the ESPE as a model. For illustration, the one or more continuous queries may be defined to apply one or more of the operations of prediction application 416 (e.g., operations 504 and 508 of FIG. 5) within the ESPE to sensed data 412 and/or control data 414 that is streamed to ESP device 708 and to output the determined set point(s) and updated rate of penetration chart to second display 417 and/or to rig control interface device 704. To create a continuous query, input event structures that are schemas with keys that flow into the one or more source windows are identified. Output event structures that are also schemas with keys that will be generated by the one or more source windows and/or the one or more derived windows are also identified. The one or more source windows and the one or more derived windows are created based on the relational, pattern matching, and procedural algorithms that transform the input event streams into the output event streams.

The ESPE may analyze and process events in motion or "event streams." Instead of storing data and running queries against the stored data, the ESPE may store queries and stream data through them to allow continuous analysis of data as it is received.

A publish/subscribe (pub/sub) capability is initialized for the ESPE. In an illustrative embodiment, a pub/sub capability is initialized for each project of the one or more projects. To initialize and enable pub/sub capability for the ESPE, a port number is provided. Pub/sub clients use the port number to establish pub/sub connections to the ESPE. The one or more continuous queries instantiated by the ESPE analyze and process the input event streams to form output event streams output to event subscribing device(s).

A pub/sub application programming interface (API) may be described as a library that enables an event publisher, such as rig control interface device 704, local data aggregator 706 and/or model definition device 200, to publish event streams into the ESPE or an event subscriber, such as second display 417 and rig control interface device 704, to subscribe to event streams from the ESPE. The pub/sub API provides cross-platform connectivity and endianness compatibility between ESP application 810 and other networked applications. The pub/sub API may include an ESP object support library so the event publisher or the event subscriber can create or manipulate the events they send or receive, respectively. For example, rig control interface device 704 may use the pub/sub API to send a stream of event blocks (event block objects) into the ESPE, and second display 417 may use the pub/sub API to receive a stream of event blocks from the ESPE.

In an operation 902, one or more event blocks that include control data 414 and/or sensed data 412 are received by the ESPE. An event block object containing one or more event objects is injected into a source window of the one or more source windows.

In an operation 904, the event blocks are processed through the one or more operations of prediction application 416 executed within the ESPE. In an operation 906, second event blocks are sent to second display 417. For example, the fluid flow back chart of FIG. 6b may be updated and output in one or more event blocks sent to second display 417 for review by an operator.

In an operation 908, third event blocks are sent to rig control interface device 704, which may interface with and/or control alarm system 418.

Similar to operation 512, in an operation 910, a determination is made concerning whether a change to predictive model 224 is performed. If the determination is to perform a model change, processing continues in an operation 912. If the determination is not to perform a model change, processing continues in operation 902 to continue to process control data 414 and sensed data 412 as it is received in real-time.

In operation 912, the project is stopped. In an operation 914, predictive model 224 of prediction application 416 is updated, for example, from model definition device 200. In an operation 916, the project in the ESPE is restarted with the updated prediction application 416, and processing continues in operation 902 to continue to process control data 414 and sensed data 412 as it is received in real-time.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, using "and" or "or" in the detailed description is intended to include "and/or" unless specifically indicated otherwise. The illustrative embodiments may be implemented as a method, apparatus, or article of manufacture using standard programming and/or engineering techniques to produce software, firmware, hardware, or any combination thereof to control a computer to implement the disclosed embodiments.

The foregoing description of illustrative embodiments of the disclosed subject matter has been presented for purposes of illustration and of description. It is not intended to be exhaustive or to limit the disclosed subject matter to the precise form disclosed, and modifications and variations are possible in light of the above teachings or may be acquired from practice of the disclosed subject matter. The embodiments were chosen and described in order to explain the principles of the disclosed subject matter and as practical applications of the disclosed subject matter to enable one skilled in the art to utilize the disclosed subject matter in various embodiments and with various modifications as suited to the particular use contemplated.

What is claimed is:

1. A non-transitory computer-readable medium having stored thereon computer-readable instructions that when executed by a computing device cause the computing device to:
   receive measured drilling data that includes a value measured for an input variable during a previous connection event of a first drilling operation;
   determine a predicted value for a fluid flow back measure by executing a predictive model with the measured drilling data as an input, wherein the predictive model is determined using previous drilling data that includes a plurality of values measured for the input variable during a second drilling operation, wherein the second drilling operation is a previous drilling operation that drilled holes at a different geographic wellbore location than the first drilling operation;
   receive a fluid flow back measurement datum determined from sensor data generated by a sensor used as part of the first drilling operation;

compare the received fluid flow back measurement datum to the determined predicted value for the fluid flow back measure; and trigger an alarm on the first drilling operation based on the comparison, wherein the alarm is triggered when the received fluid flow back measurement datum is greater than $P_v+P_vC_l/2$, where $P_v$ is the determined predicted value for the fluid flow back measure and $C_l$ is a numeric value of a confidence level.

2. The non-transitory computer-readable medium of claim 1, wherein the computer-readable instructions further cause the computing device to:

receive the previous drilling data; and determine the predictive model using the received previous drilling data.

3. The non-transitory computer-readable medium of claim 2, wherein the predictive model is determined using a neural network model.

4. The non-transitory computer-readable medium of claim 2, wherein the predictive model is determined using a decision tree model.

5. The non-transitory computer-readable medium of claim 2, wherein the predictive model is determined based on a correlation between the input variable and the fluid flow back measure identified in the received previous drilling data.

6. The non-transitory computer-readable medium of claim 5, wherein the input variable is selected from a group comprising a flow-in rate variable, a flow-out rate variable, a surface pressure variable, a downhole pressure variable, a differential pressure variable, a bit diameter variable, a fluid temperature variable, a fluid density variable, a fluid tank volume variable, a mud rheology property variable, a rate of penetration variable, a torque variable, a drill pipe rotation speed variable, and a drill bit rotation speed variable.

7. The non-transitory computer-readable medium of claim 5, wherein the fluid flow back measure is selected from a group comprising a flow back pressure, a flow back flow rate, and a flow back volume.

8. The non-transitory computer-readable medium of claim 2, wherein determining the predictive model comprises:

defining a training dataset as a first portion of the received previous drilling data;

defining a validation dataset as a second portion of the received previous drilling data;

defining a first predictive model configuration;

training a first predictive model using the defined training dataset based on the defined first predictive model configuration;

predicting model output data with the defined validation dataset as an input to the trained first predictive model;

comparing the predicted model output data to output data of the validation dataset; and determining a first validity score for the trained first predictive model based on comparing the predicted model output data to output data of the validation dataset.

9. The non-transitory computer-readable medium of claim 8, wherein determining the predictive model further comprises:

defining a second predictive model configuration;

training a second predictive model using the defined training dataset based on the defined second predictive model configuration;

predicting second model output data with the defined validation dataset as an input to the trained second predictive model;

comparing the predicted second model output data to the output data of the validation dataset; and determining a second validity score for the trained second predictive model based on comparing the predicted second model output data to the output data of the validation dataset.

10. The non-transitory computer-readable medium of claim 9, wherein the predictive model is determined as the trained first predictive model or the trained second predictive model based on a comparison between the determined first validity score and the determined second validity score.

11. The non-transitory computer-readable medium of claim 1, wherein the sensor is selected from a group comprising a flow back pressure sensor, a flow back flow rate sensor, and a flow back volume sensor.

12. The non-transitory computer-readable medium of claim 1, wherein the computer-readable instructions further cause the computing device to select the predictive model based on a geological indicator.

13. The non-transitory computer-readable medium of claim 1, wherein the computer-readable instructions further cause the computing device to change the predictive model based on a geological indicator associated with the received fluid flow back measurement datum.

14. The non-transitory computer-readable medium of claim 1, wherein the confidence level indicates a certainty that the received fluid flow back measurement datum falls within an expected variability of the determined predicted value for the fluid flow back measure.

15. The non-transitory computer-readable medium of claim 1, wherein the alarm is a display device presentation of a dial that indicates the received fluid flow back measurement datum, an acceptable fluid flow back region, a greater than acceptable fluid flow back region, and a less than acceptable fluid flow back region.

16. The non-transitory computer-readable medium of claim 1, wherein the computer-readable instructions are executed by an event stream processing engine.

17. A non-transitory computer-readable medium having stored thereon computer-readable instructions that when executed by a computing device cause the computing device to:

receive measured drilling data that includes a value measured for an input variable during a previous connection event of a first drilling operation;

determine a predicted value for a fluid flow back measure by executing a predictive model with the measured drilling data as an input, wherein the predictive model is determined using previous drilling data that includes a plurality of values measured for the input variable during a second drilling operation, wherein the second drilling operation is a previous drilling operation that drilled holes at a different geographic wellbore location than the first drilling operation;

receive a fluid flow back measurement datum determined from sensor data generated by a sensor used as part of the first drilling operation;

compare the received fluid flow back measurement datum to the determined predicted value for the fluid flow back measure;

trigger an alarm on the first drilling operation based on the comparison; and determine an acceptable fluid flow back band, wherein a maximum point of the acceptable fluid flow back band is defined as $P_v+P_vC_l/2$ and a minimum point of the acceptable fluid flow back band is defined as $P_v-P_vC_l/2$, where $P_v$ is the determined predicted value for the fluid flow back measure and $C_l$ is a numeric value of a confidence level.

18. The non-transitory computer-readable medium of claim 17, wherein the alarm is triggered when the received fluid flow back measurement datum is greater than the maximum point of the acceptable fluid flow back band or when the received fluid flow back measurement datum is less than the minimum point of the acceptable fluid flow back band.

19. The non-transitory computer-readable medium of claim 17, wherein at least one of the determined acceptable fluid flow back band or the received fluid flow back measurement datum is output to a display device.

20. The non-transitory computer-readable medium of claim 17, wherein the computer-readable instructions further cause the computing device to:
receive the previous drilling data; and
determine the predictive model using the received previous drilling data.

21. The non-transitory computer-readable medium of claim 20, wherein the predictive model is determined using a neural network model.

22. The non-transitory computer-readable medium of claim 20, wherein the predictive model is determined using a decision tree model.

23. The non-transitory computer-readable medium of claim 20, wherein the predictive model is determined based on a correlation between the input variable and the fluid flow back measure identified in the received previous drilling data.

24. The non-transitory computer-readable medium of claim 23, wherein the input variable is selected from a group comprising a flow-in rate variable, a flow-out rate variable, a surface pressure variable, a downhole pressure variable, a differential pressure variable, a bit diameter variable, a fluid temperature variable, a fluid density variable, a fluid tank volume variable, a mud rheology property variable, a rate of penetration variable, a torque variable, a drill pipe rotation speed variable, and a drill bit rotation speed variable.

25. The non-transitory computer-readable medium of claim 23, wherein the fluid flow back measure is selected from a group comprising a flow back pressure, a flow back flow rate, and a flow back volume.

26. The non-transitory computer-readable medium of claim 20, wherein determining the predictive model comprises:
defining a training dataset as a first portion of the received previous drilling data;
defining a validation dataset as a second portion of the received previous drilling data;
defining a first predictive model configuration;
training a first predictive model using the defined training dataset based on the defined first predictive model configuration;
predicting model output data with the defined validation dataset as an input to the trained first predictive model;
comparing the predicted model output data to output data of the validation dataset; and
determining a first validity score for the trained first predictive model based on comparing the predicted model output data to output data of the validation dataset.

27. The non-transitory computer-readable medium of claim 26, wherein determining the predictive model further comprises:
defining a second predictive model configuration;
training a second predictive model using the defined training dataset based on the defined second predictive model configuration;
predicting second model output data with the defined validation dataset as an input to the trained second predictive model;
comparing the predicted second model output data to the output data of the validation dataset; and
determining a second validity score for the trained second predictive model based on comparing the predicted second model output data to the output data of the validation dataset.

28. The non-transitory computer-readable medium of claim 27, wherein the predictive model is determined as the trained first predictive model or the trained second predictive model based on a comparison between the determined first validity score and the determined second validity score.

29. The non-transitory computer-readable medium of claim 17, wherein the sensor is selected from a group comprising a flow back pressure sensor, a flow back flow rate sensor, and a flow back volume sensor.

30. The non-transitory computer-readable medium of claim 17, wherein the computer-readable instructions further cause the computing device to select the predictive model based on a geological indicator.

31. The non-transitory computer-readable medium of claim 17, wherein the computer-readable instructions further cause the computing device to change the predictive model based on a geological indicator associated with the received fluid flow back measurement datum.

32. The non-transitory computer-readable medium of claim 17, wherein the alarm is a display device presentation of a dial that indicates the received fluid flow back measurement datum, an acceptable fluid flow back region, a greater than acceptable fluid flow back region, and a less than acceptable fluid flow back region.

33. The non-transitory computer-readable medium of claim 17, wherein the computer-readable instructions are executed by an event stream processing engine.

34. A computing device comprising:
a processor; and
a non-transitory computer-readable medium operably coupled to the processor, the computer-readable medium having computer-readable instructions stored thereon that, when executed by the processor, cause the computing device to:
receive measured drilling data that includes a value measured for an input variable during a previous connection event of a first drilling operation;
determine a predicted value for a fluid flow back measure by executing a predictive model with the measured drilling data as an input, wherein the predictive model is determined using previous drilling data that includes a plurality of values measured for the input variable during a second drilling operation, wherein the second drilling operation is a previous drilling operation that drilled holes at a different geographic wellbore location than the first drilling operation;
receive a fluid flow back measurement datum determined from sensor data generated by a sensor used as part of the first drilling operation;
compare the received fluid flow back measurement datum to the determined predicted value for the fluid flow back measure;
trigger an alarm on the first drilling operation based on the comparison; and
determine an acceptable fluid flow back band, wherein a maximum point of the acceptable fluid flow back band is defined as $P_v + P_v C_l / 2$ and a minimum point of the acceptable fluid flow back band is defined as $P_v - P_v C_l / 2$, where $P_v$ is the determined predicted value for the fluid flow back measure and $C_l$ is a numeric value of a confidence level.

35. The computing device of claim 34, wherein the computer-readable instructions further cause the computing device to select the predictive model based on a geological indicator.

36. The computing device of claim 34, wherein the alarm is triggered when the received fluid flow back measurement datum is greater than the maximum point of the acceptable fluid flow back band or when the received fluid flow back measurement datum is less than the minimum point of the acceptable fluid flow back band.

37. The computing device of claim 34, wherein the computer-readable instructions are executed by an event stream processing engine.

38. The computing device of claim 34, wherein the computer-readable instructions further cause the computing device to change the predictive model based on a geological indicator associated with the received fluid flow back measurement datum.

39. A method of determining when an alarm is triggered for a physical drilling operation, the method comprising:
receiving measured drilling data that includes a value measured for an input variable during a previous connection event of a first drilling operation;
determining, by a computing device, a predicted value for a fluid flow back measure by executing a predictive model with the measured drilling data as an input, wherein the predictive model is determined using previous drilling data that includes a plurality of values measured for the input variable during a second drilling operation, wherein the second drilling operation is a previous drilling operation at a different geographic wellbore location than the first drilling operation;
receiving a fluid flow back measurement datum determined from sensor data generated by a sensor used as part of the first drilling operation;
comparing, by the computing device, the received fluid flow back measurement datum to the determined predicted value for the fluid flow back measure;
triggering, by the computing device, an alarm on the first drilling operation based on the comparison; and
determining, by the computing device, an acceptable fluid flow back band, wherein a maximum point of the acceptable fluid flow back band is defined as $P_v+P_vC_l/2$ and a minimum point of the acceptable fluid flow back band is defined as $P_v-P_vC_l/2$, where $P_v$ is the determined predicted value for the fluid flow back measure and $C_l$ is a numeric value of a confidence level.

40. The method of claim 39, further comprising selecting the predictive model based on a geological indicator.

41. The method of claim 39, further comprising changing, by the computing device, the predictive model based on a geological indicator associated with the received fluid flow back measurement datum.

42. The method of claim 39, wherein the alarm is triggered when the received fluid flow back measurement datum is greater than the maximum point of the acceptable fluid flow back band or when the received fluid flow back measurement datum is less than the minimum point of the acceptable fluid flow back band.

43. The method of claim 39, wherein the input variable is selected from a group comprising a flow-in rate variable, a flow-out rate variable, a surface pressure variable, a downhole pressure variable, a differential pressure variable, a bit diameter variable, a fluid temperature variable, a fluid density variable, a fluid tank volume variable, a mud rheology property variable, a rate of penetration variable, a torque variable, a drill pipe rotation speed variable, and a drill bit rotation speed variable.

44. The method of claim 39, wherein the computing device determines the predicted value, compares the received fluid flow back measurement datum, triggers the alarm, and determines the acceptable fluid flow back band using an event stream processing engine.

* * * * *